(12) United States Patent
Choi

(10) Patent No.: US 9,984,758 B2
(45) Date of Patent: May 29, 2018

(54) NON-VOLATILE MEMORY DEVICE AND METHOD OF FABRICATING THE SAME

(71) Applicants: SK hynix Inc., Icheon (KR); SOGANG UNIVERSITY RESEARCH FOUNDATION, Seoul (KR)

(72) Inventor: Woo Young Choi, Seoul (KR)

(73) Assignees: SK HYNIX INC., Icheon (KR); SOGANG UNIVERSITY RESEARCH FOUNDATION, Seoul (KR)

( * ) Notice: Subject to any disclaimer, the term of this patent is extended or adjusted under 35 U.S.C. 154(b) by 0 days. days.

(21) Appl. No.: 15/658,293

(22) Filed: Jul. 24, 2017

(65) Prior Publication Data

US 2018/0025783 A1     Jan. 25, 2018

(30) Foreign Application Priority Data

Jul. 25, 2016 (KR) .................. 10-2016-0094019

(51) Int. Cl.
| | | |
|---|---|---|
| G11C 11/34 | (2006.01) | |
| G11C 16/04 | (2006.01) | |
| G11C 16/34 | (2006.01) | |
| H01L 27/1157 | (2017.01) | |
| H01L 27/11573 | (2017.01) | |
| H01L 27/11582 | (2017.01) | |
| G11C 16/08 | (2006.01) | |
| G11C 16/10 | (2006.01) | |

(52) U.S. Cl.
CPC .......... *G11C 16/34* (2013.01); *G11C 16/0466* (2013.01); *G11C 16/08* (2013.01); *G11C 16/10* (2013.01); *H01L 27/1157* (2013.01); *H01L 27/11573* (2013.01); *H01L 27/11582* (2013.01); *G11C 16/0483* (2013.01); *G11C 2216/02* (2013.01)

(58) Field of Classification Search
CPC ..... G11C 16/34; G11C 16/0466; G11C 16/08; G11C 16/0483; G11C 2216/02; H01L 27/1157; H01L 27/11573; H01L 27/11582
See application file for complete search history.

(56) References Cited

U.S. PATENT DOCUMENTS

| | | | | |
|---|---|---|---|---|
| 8,441,063 B2* | 5/2013 | Fang | ................ | H01L 21/28282 257/324 |
| 8,750,040 B2* | 6/2014 | Goda | ................ | H01L 27/11524 365/185.05 |
| 2005/0006697 A1* | 1/2005 | Hsieh | .................... | H01L 27/115 257/317 |
| 2009/0045452 A1* | 2/2009 | Lue | .................... | G11C 16/0466 257/321 |
| 2010/0240205 A1* | 9/2010 | Son | ................... | H01L 27/11551 438/588 |

(Continued)

FOREIGN PATENT DOCUMENTS

| | | |
|---|---|---|
| KR | 10-1491714 B1 | 2/2015 |
| KR | 10-2015-0132470 A | 11/2015 |

*Primary Examiner* — Toan Le

(57) ABSTRACT

Provided are a non-volatile memory device and a method of fabricating the same. The non-volatile memory includes a channel layer; a data storage layer disposed on the channel layer; a plurality of control gates arranged on the data storage layer and spaced apart from one another; and one or more sub-gates, at least one of the sub-gates being arranged between two adjacent control gates.

19 Claims, 15 Drawing Sheets

(56) References Cited

U.S. PATENT DOCUMENTS

| | | | |
|---|---|---|---|
| 2012/0132981 A1* | 5/2012 | Imamura | H01L 27/11556 257/321 |
| 2012/0313159 A1* | 12/2012 | Sim | H01L 21/28273 257/324 |
| 2014/0264532 A1* | 9/2014 | Dennison | H01L 29/66833 257/316 |

* cited by examiner

NON-VOLATILE MEMORY DEVICE AND METHOD OF FABRICATING THE SAME

CROSS-REFERENCES TO RELATED APPLICATION

The present application claims priority under 35 U.S.C. 119(a) to Korean Patent Application number 10-2016-0094019, filed on Jul. 25, 2016, which is herein incorporated by reference in its entirety.

BACKGROUND

1. Field of the Invention

The present disclosure relates to a semiconductor technique, and more particularly, to a non-volatile memory device and a method of fabricating the same.

2. Description of the Related Art

Due to increased demands for portable application devices, such as digital cameras, smart phones, and tablet PCs, markets for non-volatile memory devices are rapidly growing. Non-volatile memory devices include read-only memory (ROM), programmable ROM (PROM), erasable PROM (EPROM), electrically EPROM (EEPROM), and flash memory devices. Among these non-volatile memory devices, flash memory devices, such as NAND flash memory devices, are some of the most prominent non-volatile memory devices contributing to miniaturization and high efficiency of the portable application devices.

Among flash memory devices, a charge-trap type flash memory device programs a memory cell by continuously retaining charges stored by tunneling the charges or injecting hot electrons into a charge trapping storage layer in the memory cell, and erases the memory cell by removing the stored charges. In this case, when charges stored in a programmed memory cell are lost according to lapse of the time, it is determined that the charges are erased due to reduction of a threshold voltage of the programmed memory cell, and thus a read error may occur. Therefore, in order to secure reliability of the flash memory device, excellent data retention is required.

Recently, as higher integration and larger capacity of types of non-volatile memory devices, like flash memory devices, are continuously demanded, memory cells are being continuously downscaled and demand for multi-level memory cells increases. In order to downscale memory cells and implement a reliable multi-level memory device, it is necessary to resolve deterioration of a data retention characteristic related with a change of a threshold voltage which may be caused as program charges in a charge trapping storage layer spread toward adjacent memory cells. Furthermore, the program charges moving to or accumulated in inter-memory cell regions of a charge trapping storage layer due to a programming operation, an erasing operation, or a temperature cycling operation, may deteriorate program-erase cycling characteristics of memory cells, and may also deteriorate an incremental step pulse programming (ISPP) operation on memory cells.

SUMMARY

The present disclosure provides a non-volatile memory device with improved data retention performance and a reliable program-erase cycling characteristic by suppressing accumulation of trapped charges in a space between memory cells in coping with continuous downscaling of the memory cells or multi-level programming of the memory cells.

The present disclosure also provides a method of fabricating a non-volatile memory device having the above-stated advantages.

According to an aspect of the present disclosure, there is provided a non-volatile memory device including a channel layer; a data storage layer disposed on the channel layer; a plurality of control gates arranged on the data storage layer and spaced apart from one another; and one or more sub-gates, at least one of the sub-gates being arranged between two adjacent control gates.

According to an embodiment, during a programming operation, a voltage may be applied to the sub-gate adjacent to a selected control gate from among the plurality of control gates, the voltage applied to the adjacent sub-gate having a polarity opposite to a polarity of a program voltage, the program voltage being applied to the selected control gate. Furthermore, during a programming operation, an unselected sub-gate may be electrically floated or an inhibit voltage may be applied to the unselected sub-gate.

According to an embodiment, a ratio of a width of each sub-gate to a distance from a sub-gate to an adjacent control gate may be from 0.1 to 1. The one or more sub-gates may comprise a conductive material identical to a conductive material of the plurality of control gates.

Each of the sub-gates may comprise any one of a doped poly-silicon, aluminum (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof. The data storage layer may comprise a tunneling insulation layer contacting the channel layer; a blocking insulation layer contacting the plurality of control gates; and a charge trapping storage layer disposed between the tunnelling insulation layer and the blocking insulation layer.

The channel layer may extend in a direction vertical to a main surface of a substrate on which the non-volatile memory device is to be formed. The data storage layer may be shared by the plurality of control gates. The non-volatile memory device may have a SMArT structure, a bit cost scalable (BiCS) structure, a piped BiCS (P-BiCS) structure, a vertical-recess-array-transistor) structure, or a terabit cell array transistor (TCAT) structure.

According to another aspect of the present disclosure, there is provided a non-volatile memory device including memory cell strings, each memory cell string comprising a plurality of memory cells connected to one another in series; wordlines connected to control gates of the plurality of memory cells, respectively; sub-wordlines, at least one of the sub-wordlines being arranged between two adjacent wordlines; bitlines connected to first ends of the memory cell strings, respectively; a row decoder electrically connected to the plurality of memory cells via the wordlines and the sub-wordlines; and a column decoder electrically connected to the memory cell strings via the bitlines.

A number of the sub-wordlines may be one less than a total number of the wordlines. During a programming operation, a voltage having a polarity opposite to a polarity of a program voltage may be applied to a sub-wordline adjacent to a selected wordline from among the plurality of wordline, the program voltage being applied to the selected wordline. During a programming operation, an unselected sub-wordline may be electrically floated or an inhibit voltage may be applied to the unselected sub-wordline.

According to an aspect of the present disclosure, there is provided a method of fabricating a non-volatile memory device, the method including forming a stacked structure by alternately and repeatedly forming one or more insulation layers and a plurality of conductive layers on a substrate, wherein the plurality of conductive layers comprise first conductive layers for forming control gates and second conductive layers for forming sub-gates, at least one of the sub-gates being formed between two adjacent control gates; forming via holes extending in a vertical direction that is normal to a main surface of the substrate by patterning the stacked structure; forming a data storage layer on a sidewall of each of the via holes; and forming a semiconductor pillar comprising a channel layer in a groove region defined by the data storage layer in each of the via holes.

The first conductive layers and the second conductive layers may comprise an identical conductive material. The second conductive layer may comprise any one of a doped poly-silicon, aluminum (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof. A ratio of a width of the second conductive layer to a distance from the second conductive layer to an adjacent first conductive layer may be from 0.1 to 1. The data storage layer may include a tunneling insulation layer contacting the channel layer; a blocking insulation layer contact the plurality of control gates; and a charge trapping storage layer between the tunnelling insulation layer and the blocking insulation layer.

According to an embodiment of the present disclosure, during a programming operation regarding a selected memory cell, as at least one or more sub-gates arranged between a selected control gate and an unselected control gate adjacent thereto suppress a magnitude and a dispersion width of a fringing field dispersed from sidewalls of control gates to a channel layer, tunnelling of program charges to inter-memory cell regions of a data storage layer is suppressed, thereby minimizing accumulation of trapped charges. As a result, a non-volatile memory device with improved data retention characteristic and reliable program-erase cycling characteristic may be provided.

Furthermore, according to another embodiment, a method of fabricating a non-volatile memory device having the above-stated advantages may be provided.

BRIEF DESCRIPTION OF THE DRAWINGS

The above and other features and advantages of the present disclosure will become more apparent from the following embodiments and the attached drawings in which.

DETAILED DESCRIPTION OF THE INVENTION

Figure 1:
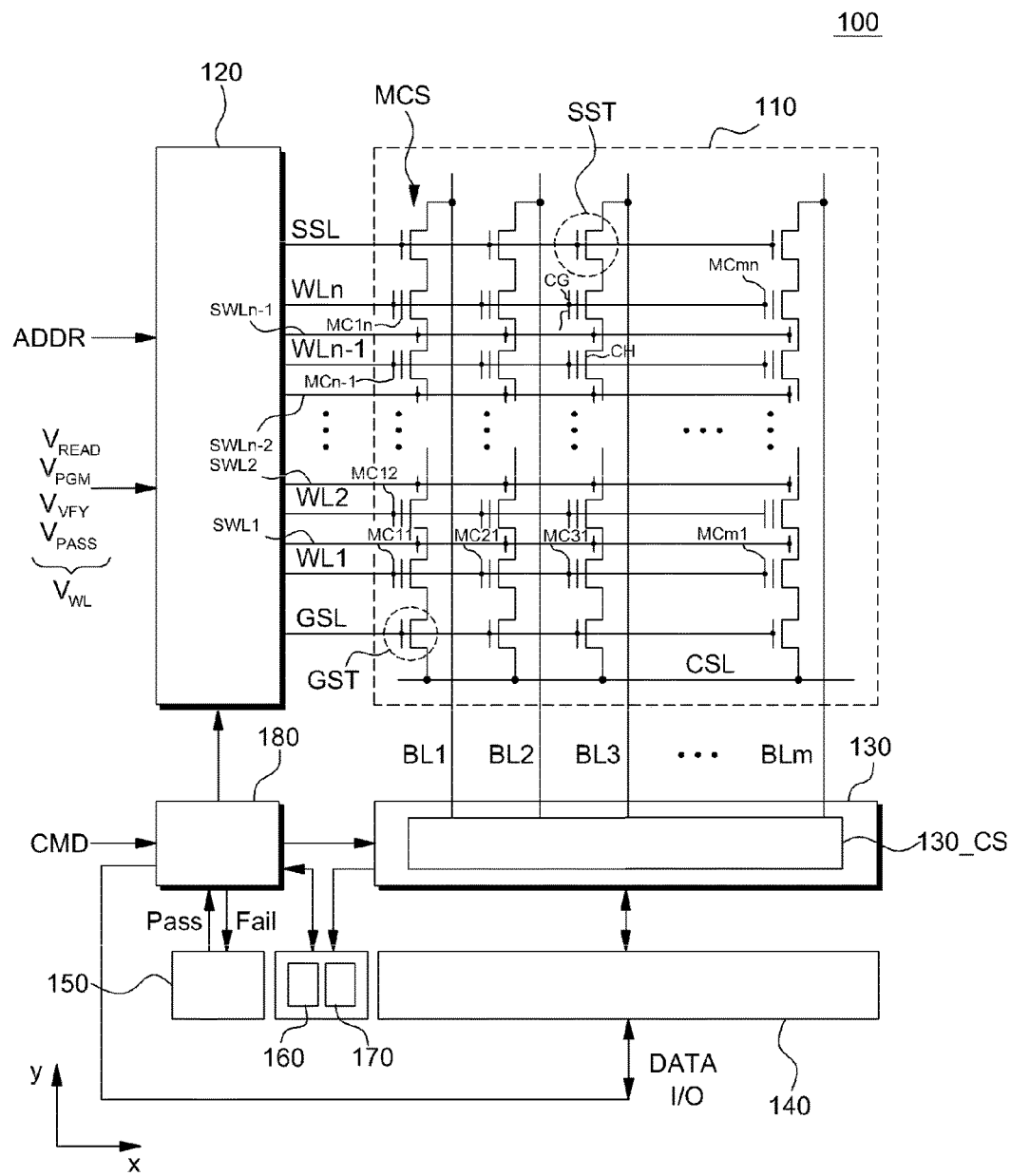
FIG. 1 is a block diagram of a non-volatile memory device according to an embodiment.

The present disclosure will now be described more fully with reference to the accompanying drawings, in which exemplary embodiments are shown. The present disclosure may, however, be embodied in many different forms and should not be construed as being limited to the embodiments set forth herein; rather, these embodiments are provided so that this disclosure will be thorough and complete, and will fully convey the concept of the embodiments to those skilled in the art.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Furthermore, a structure or a form shape "adjacent to" another shape may overlap the adjacent shape or be arranged below the adjacent shape.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

The present disclosure will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIG. 1 is a block diagram of a non-volatile memory device 100 according to an embodiment.

Referring to FIG. 1, the non-volatile memory device 100 may include a memory cell array 110 including a plurality of memory cells MC11, MC12, ..., and MCmn, a row decoder 120, a read/write circuit 130, and a column decoder 140. The memory cell array 110 may be connected to the row decoder 120 via wordlines WL1, WL2, WLn-1, and WLn, a string select line SSL, and a ground select line GSL, m and n being positive integers. Furthermore, the memory cell array 110 may be connected to the read/write circuit 130 via bitlines BL1, BL2, BL3, ..., and BLm.

When the non-volatile memory device 100 is a NAND flash memory device, the memory cell array 110 may include memory cell strings MCS, where each of the memory strings MCS consists of a plurality of memory cells, e.g., MC11, MC12, ..., MC1n-1, and MC1n that may be connected to one another in series. String select transistors SST for selecting the memory cell strings MCS and a string select line SSL for driving the string select transistors SST may be coupled with first ends of the memory cell strings MCS, respectively. According to some embodiments, there may be two or more string select transistors SST coupled to each memory cell string MCS and two or more string select lines SSL coupled to the memory cell strings MCS according to string selection modes of a 3-dimensional non-volatile memory device.

Ground select transistors GST and a ground select line GSL for driving the ground select transistors GST may be coupled with second ends of the memory cell strings MCS, respectively. According to some embodiments, there may be two or more ground select transistors GST coupled to each memory cell string MCS and two or more ground select lines GSL coupled to the memory cell strings MCS according to string selection modes of a 3-dimensional non-volatile memory device.

The string select transistor SST and the ground select transistor GST may be called interchangeably with each other, may be referred only as either of the terms, or may be referred to commonly as select transistors, but the present disclosure shall not be limited thereby. Furthermore, the string select transistor SST and the ground select transistor GST are not limited to MOS transistors illustrated in FIG. 1, and may also have a non-volatile memory cell structure like a transistor of a memory cell MC in FIG. 1, in order to select a string by using a threshold voltage based on a certain status value.

According to some embodiments, first ends of the ground select transistors GST may be electrically connected to a common source line CSL. First ends of the string select transistors SST coupled to the memory cell strings MCS may be connected to the bitlines BL1, BL2, BL3, ..., and BLm, respectively. The wordlines WL1, WL2, ..., and WLn may be connected to control gate electrodes of memory cells arranged in a memory cell string MCS, respectively.

One or more sub-wordlines SWL1, SWL2, ..., and SWLn-1 may be arranged between adjacent wordlines, for example, between wordlines WL1 and WL2 and between wordlines WL2 and WL3. The sub-wordlines SWL1, SWL2, ..., and SWLn-1 may be controlled by the row decoder 120 like the wordlines WL1, WL2, ..., WLi, ..., and WLn. The sub-wordlines SWL1, SWL2, ..., and SWLn-1 may be coupled with a channel CH shared by memory cells MC11, MC12, ..., and MCmn and, as described below. The sub-wordlines SWL1, SWL2, ..., and SWLn-1 may limit accumulation of program charges in inter-memory cell regions due to a fringing field from side surfaces of a selected control gate CG. According to an embodiment, the number of the sub-wordlines SWL1, SWL2, ..., and SWLn-1 may be one less than the total number of the wordlines WL1, WL2, ..., and WLn.

The memory cells MC11, MC21, MC 31, ..., and MCm1, which are arranged over the memory cell strings MCS and connected to a single wordline, e.g., the wordline WL1, may constitute a logic page. The number of logic pages in the memory cell array 110 may be determined based on storage capacity of the memory cells in the memory cell array 110. For example, according to storage levels, a single-level cell (SLC) memory stores 1 bit of data per memory cell, a multi-level cell (MLC) memory stores 2 bits of data per memory cell, an 8LC memory stores 3 bits of data per memory cell, and a 16LC memory stores 4 bits of data per memory cell.

In an embodiment, the plurality of memory cells MC11, MC12, ..., and MCmn of the memory cell array 110 may have a 2-dimensional array structure parallel to a main surface of a substrate. In another embodiment, the plurality of memory cells MC11, MC12, ..., and MCmn of the memory cell array 110 may have a vertically stacked 3-dimensional array structure including two or more stacked channel layers CH parallel to the main surface of the substrate.

The memory cells MC11, MC21, MC31, ..., and MCm1 constituting the logic page may be programmed in a same program cycle. For example, the memory cells MC11, MC21, MC31, ..., and MCm1 connected to the first wordline WL1 may be programmed to the same program state (or the same target value) or different program states in the same program cycle. In the case of an MLC device, since each memory cell stores one least significant bit (LSB) and one most significant bit (MSB), the MLC device may have four logic pages. For example, in this case, MSB pages and LSB pages on even-numbered bitlines and MSB pages and LSB pages on odd-numbered bitlines may be provided.

The row decoder 120 may select any one of a plurality of wordlines of a selected memory block. The row decoder 120 may apply a wordline voltage $V_{WL}$ from a voltage generator (not shown) to the selected wordline of the selected memory block. According to an embodiment, during a reading operation, the row decoder 120 may perform a field-effect transistor mode operation for applying a read voltage $V_{READ}$ to a selected wordline and applying a pass voltage $V_{PASS}$ to an unselected wordline. During a programming operation, a program voltage $V_{PGM}$ and a verify voltage $V_{VFY}$ may be applied to the selected wordline, whereas the unselected wordline may be grounded or a program inhibit voltage may be applied to the unselected wordline. In addition, during the programming operation, a voltage $V_{SWL}$ having a polarity opposite to that of the program voltage $V_{PGM}$ may be applied to sub-wordlines adjacent to the selected wordline.

The memory cell array 110 may be addressed by the bitlines BL1, BL2, BL3, ..., and BLm via the column decoder 140. A read/program circuit 130_CS included in the read/write circuit 130 may receive write data transmitted from an external circuit or may transmit read-out data to the external circuit via the column decoder 140.

The read/program circuit 130_CS may include a page buffer (not shown), and may operate as a sense amplifier or a program driver according to operation modes. In the present disclosure, a read/program circuit and a page buffer may be used as equivalent terms, but the present disclosure is not limited thereby. During a programming operation, the read/program circuit 130_CS receives write data to be programmed from an external circuit and transmits a bitline voltage corresponding to the write data to a bitline of the cell array 110. During a read operation, the read/program circuit 130_CS may read out data stored in a selected memory cell via a bitline, latch the read-out data, and output the latched read-out data to the external circuit.

The read/program circuit 130_CS may perform a verification operation in association with the programming operation regarding the selected memory cell in response to a transmission signal transmitted from a control logic 180 and, in response to the transmission signal, may output a result of the verification operation as page buffer signals over a number of times. According to an embodiment, the read operation of the read/program circuit 130_CS may be performed based on charge integration using a bitline parasitic capacitor.

According to an embodiment, memory cells may be programmed page by page by using an incremental step pulse programming (ISPP) technique. A verification operation for determining whether a threshold voltage $V_{THR}$ of a selected memory cell reached a level of a target voltage Vth may be performed via a bitline by a current sensing circuit combined with the bitline. According to an embodiment, the current sensing circuit may be provided in the read/write circuit 130.

The control logic 180 may execute program-verify loops based on the ISPP technique to program selected memory cells. A pass/fail verifying circuit 150 may verify whether a threshold voltage $V_{THR}$ of a selected memory cell reaches a desired level every time when a program loop count increases. If the selected memory cell has a desired threshold value, i.e., a target value, the program operation is determined as a program pass, and then the program operation and verification operation verifying the programming regarding the selected memory cell are terminated. However, if the memory cell does not have the desired target value, the pass/fail verifying circuit 150 determines that the program operation is a program fail, and then the pass/fail verifying circuit 150 may generate a count signal (not shown). The pass/fail verifying circuit 150 may determine whether the program operation is successful or not, and may transmit a result of the determination to the control logic 180.

In response to a command CMD provided by an external circuit, the control logic 180 may control the row decoder 120, the read/write circuit 130, the column decoder 140, the pass/fail verifying circuit 150, a program loop turn detector 160, and/or a comparator 170, thereby performing a pulse-program operation and a verification operation according to the ISPP technique. When a result of the program fail is received from the pass/fail verifying circuit 150, the control logic 180 may control a voltage generator (not shown) to generate a program voltage $V_{PGM}$ and a verify voltage $V_{VFY}$, and control the page buffer 130_CS to proceed a subsequent program loop. On the contrary, when the control logic 180 receives a result of the program pass, a program operation on the selected memory cell will be terminated.

In various embodiments, the control logic 180 may be integrated on a single chip with the memory cell array 110, or may be arranged on a different chip from the memory cell array 110, but the present disclosure is not limited thereto. For example, in a solid state drive (SSD), the control logic 180 may be provided at a flash translation layer (FTL), which is an independent chip separated from the memory cell array 110.

Furthermore, although the pass/fail verifying circuit 150, the program loop turn detector 160, and the comparator 170 described above are formed separately from the control logic 180, the present disclosure is not limited thereto. For example, at least one of the pass/fail verifying circuit 150, the program loop turn detector 160, and the comparator 170 may be implemented as software or hardware in the control logic 180. Furthermore, at least one of the pass/fail verifying circuit 150, the program loop turn detector 160, and the comparator 170 may be omitted, or another circuit component may be added.

Figure 2:
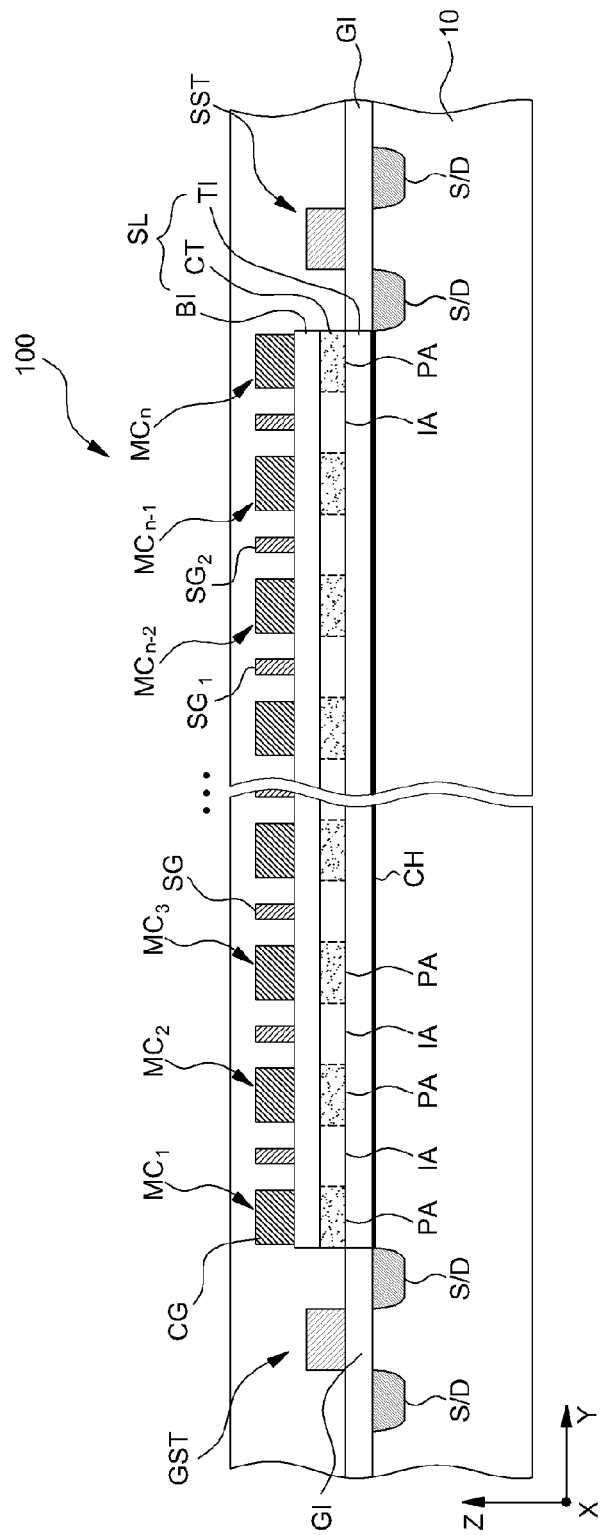
FIG. 2 is a cross-sectional view of a memory cell structure of a non-volatile memory device according to an embodiment.

FIG. 2 is a cross-sectional view of a memory cell structure of a non-volatile memory device 100 according to an embodiment of the present disclosure.

Referring to FIG. 2, the non-volatile memory device 100 may include a plurality of memory cells MC1, MC2, MC3, ..., MCn-1, and MCn formed on a substrate 10. The plurality of memory cells MC1, MC2, MC3, ..., MCn-1, and MCn may constitute a planar-type memory cell array that is parallel to a main surface of the substrate 10.

When the non-volatile memory device 100 is a NAND flash memory device, the plurality of memory cells MC1, MC2, MC3, ..., MCn-1, and MCn may be aligned in a first direction, e.g., the y-axis direction, parallel to the main surface of the substrate 10, as shown in FIG. 2. The plurality of memory cells MC1, MC2, MC3, ..., MCn-1, and MCn may share a channel layer CH and a data storage layer SL. The channel layer CH extends in the y-axis direction, and the data storage layer SL is disposed on the channel layer CH and extends along the channel layer CH in the y-axis direction. The channel layer CH may be coupled with a control gate CG via the data storage layer SL.

The data storage layer SL may include a first insulation layer TI, a charge trapping storage layer CT, and a second insulation layer BI. The charge trapping storage layer CT is disposed over the channel layer CH, and the first insulation layer TI is disposed between the charge trapping storage layer CT and the channel layer CH. The second insulation layer BI is disposed between the charge trapping storage layer CT and the control gate CG. The first insulation layer TI may be a tunnelling insulation layer, the second insulation layer BI may be a blocking insulation layer, and the charge trapping storage layer CT may be an insulation layer including sites capable of trapping electrons or holes.

According to an embodiment, the channel layer CH may include the same material as a material constituting the substrate 10, and may be an active region disposed at a surface of the substrate 10. According to another embodiment, the channel layer CH may be an independent semiconductor structure separate from the substrate 10. For example, the channel layer CH may be a semiconductor structure formed on the substrate 10, such as a semiconductor thin-film or a semiconductor pillar.

The channel layer CH may include a single-component system semiconductor, such as silicon (Si) or carbon (C), a binary-component system semiconductor, such as silicon-germanium, silicon-carbon, indium nitride (InN), gallium arsenide (GaAS), molybdenum silicide ($MoSi_2$), or gallium nitride (GaN), or a three or more-component system compound semiconductor, such as $Al_xGa_{1-x}N$ or $In_xAl_yGa_{1-x-y}N$. Furthermore, the channel layer CH may have a monocrystalline structure or a polycrystalline structure, but the present disclosure is not limited thereto.

According to an embodiment, the channel layer CH may include a single layer structure including one of the above-stated materials, or may have a multi-layer structure including two or more of the above-stated materials. Furthermore, if necessary, the channel layer CH may have a strained lattice structure in order to increase mobility of charges in the channel layer CH. The channel layer CH is not limited to a 2-dimensional planar structure, and may have a 3-dimensional shape formed along a certain curvature of a surface of the substrate 10, where such the structures of the channel layer CH may be stacked or repeated at least twice in a direction that is vertical to the main surface of the substrate 10, e.g., the z-axis direction.

According to an embodiment, an impurity region, such as a source/drain region S/D, may be formed in the substrate 10. According to an embodiment, an impurity junction region may be omitted in the channel layer CH to provide a junction-free NAND structure. In the junction-free NAND structure, virtual source/drain regions may be formed due to an electrical doping effect based on a fringing field of control gates CG, thereby completing the electrical connection of memory cells in series. According to another embodiment, the channel layer CH may include an N+ conductive type dopant, and thus a junction-less NAND structure with an increased turn-on current than a channel layer including no dopant may be provided. However, the junction-free or junction-less NAND structure is merely an example, and the present disclosure is not limited thereto. In another example, the channel layer CH may include a P+ conductive type dopant, such that memory cell transistors may operate in an enhanced mode.

The first insulation film TI may include a suitable dielectric layer having an injecting and extracting mechanism capable of transferring electrons or holes between the channel layer CH and the charge trapping storage layer CT. The first insulation film TI may contain a silicon oxide, e.g., $SiO_2$. According to another embodiment, a different dielectric layer or a stacked structure may be applied to prevent deterioration of the first insulation film TI due to repeated cycles of reading/programming operations, e.g., increase of trapped charge density or insulation destruction. Furthermore, a suitable dielectric layer may be selected for a band-engineered tunnel stack that is adjusted to improve an erasing speed while maintaining fine data retention characteristics of the memory device. The adjusted band-engineered tunnel stack may be designed to improve the erasing speed by activating hole injection to the charge trapping storage layer CT during an erasing operation and to prevent cycling deterioration of the memory device. According to an embodiment, the first insulation film TI may not only extend into a plurality of memory cells, but also extend into transistors GST and SST at respective ends of a memory string to function as gate insulation layers GI of the transistors GST and SST.

The charge trapping storage layer CT may include a dielectric layer having a high free trap density. The charge trapping storage layer CT may contain a silicon nitride or another dielectric material capable of trapping charges. The charge trapping storage layer CT extends to a plurality of memory cells and is shared by the plurality of memory cells, e.g., MC1, MC2, MC3, . . . , MCn−1, and MCn. Furthermore, instead of being individualized to each memory cell, the charge trapping storage layer CT may be integrally formed with a string, a page, a block, or a plane.

The integrally formed charge trapping storage layer CT includes program regions PA, which are respectively arranged below the control gates CG. The program regions PA are regions in which data is programmed or erased as charges are injected thereto or discharged therefrom according to the quantum effect of charges, e.g., the Fowler-Nordheim tunnelling mechanism, based on a direction of an electric field applied between a selected control gate CG and the channel layer CH. In this regard, data may be written through the variation of threshold voltages $V_{TH}$ of respective memory cells caused by charges trapped in the program regions PA of the charge trapping storage layer CT. The integrally formed charge trapping storage layer CT further includes inter-memory cell regions IA between the program regions PA.

The second insulation film BI may include a blocking insulation layer for preventing charges trapped in the charge trapping storage layer CT from being spread to the control gate CG. The second insulation film BI may contain a silicon oxide, e.g., $SiO_2$. However, the silicon oxide is merely an example, and embodiments of the second insulation film BI are not limited to the silicon oxide. To improve data retention characteristics, the second insulation film BI may contain a high-k material capable of increasing a physical film thickness while securing a superb equivalent oxide film thickness (EOT). The high-k material may include aluminium oxide ($Al_2O_3$), yttrium oxide ($Y_2O_3$), silicon nitride ($Si_3N_4$), tantalum oxide ($Ta_2O_5$), lanthanum oxide ($La_2O_3$), hafnium oxide ($HfO_2$), or titanium oxide ($TiO_2$).

The control gates CG may be respectively coupled with wirings for addressing, e.g., the wordlines WL1, WL2, . . . , and WLn as shown in FIG. 1. A conductor for forming the control gates CG may include at least one of a doped poly-silicon, aluminium (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof (e.g., tungsten silicide (WSi), titanium silicide ($TiSi_2$), cobalt silicide ($CoSi_2$), nickel silicide (NiSi), platinum silicide ($PtSi_2$), erbium silicide ($ErSi_2$), or molybdenum silicide ($MoSi_2$)), a conductive nitride thereof (e.g., titanium nitride (TiN), tantalum nitride (TaN), or tantalum silicon nitride (TaSiN)), and a conductive oxide thereof (e.g., ruthenium oxide ($RuO_2$)) or strontium titanium oxide ($SrTiO_3$)). However, the above-stated materials are merely examples, and embodiments are not limited thereto.

The non-volatile memory device 100 may include at least one sub-gate SG between adjacent control gates CG. According to another embodiment, sub-gates SG may be provided at two opposite sides of control gates CG. For example, a sub-gate SG2 may be provided between a control gate CG of a memory cell MCn−2 and a control gate CG of a memory cell MCn−1 adjacent to the memory cell MCn−2. In other view, sub-gates SG1 and SG2 may be provided at two opposite sides of a control gate CG of a memory cells, for example, the memory cell MCn−2.

According to some embodiments, as shown in FIG. 2, the sub-gate SG may be omitted at outer sides of the first memory cell MC1 at a first end of a memory cell string and the last memory cell MCn at a second end of the memory cell string. The sub-gates SG may include a conductor material identical to a conductor material of control gates CG, but the present disclosure is not limited thereto.

Figure 3A:
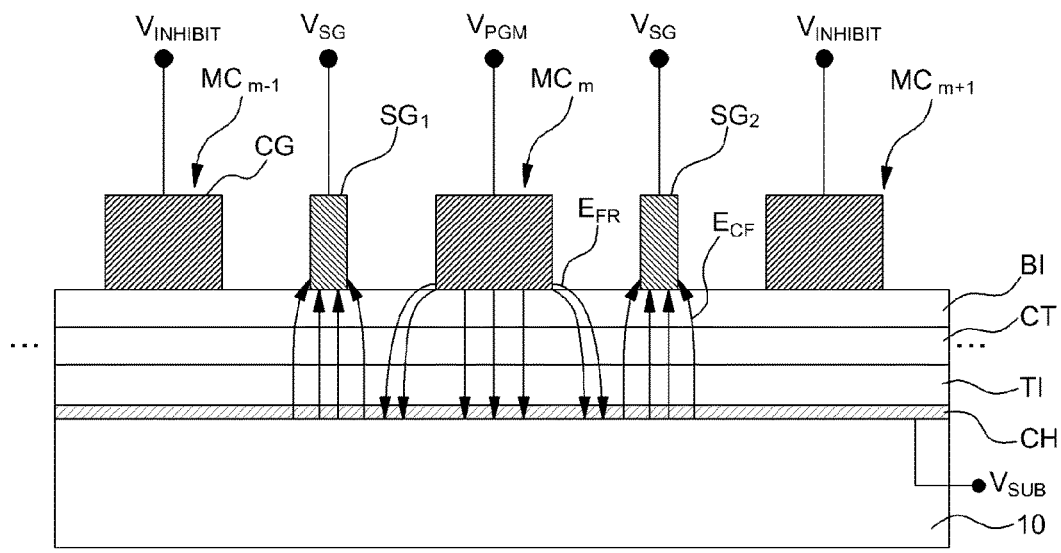
FIGS. 3A and 3B are schematic diagrams showing a distribution of electric fields and a distribution of program charges trapped in a charge trapping storage layer depending on the distribution of the electric fields, during a programming operation on a non-volatile memory cell including a sub-gate, according to an embodiment.
Figure 3B:
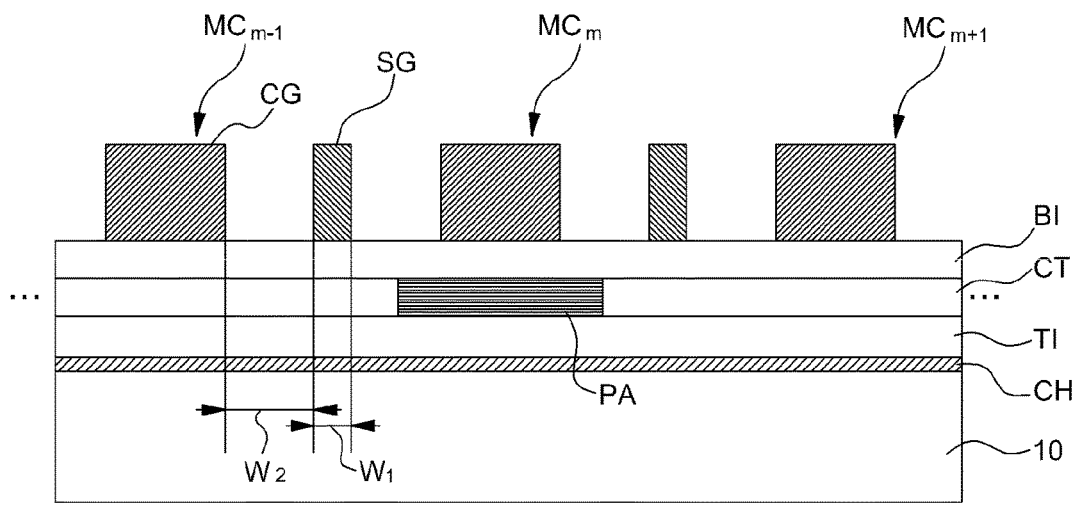
Figure 4A:
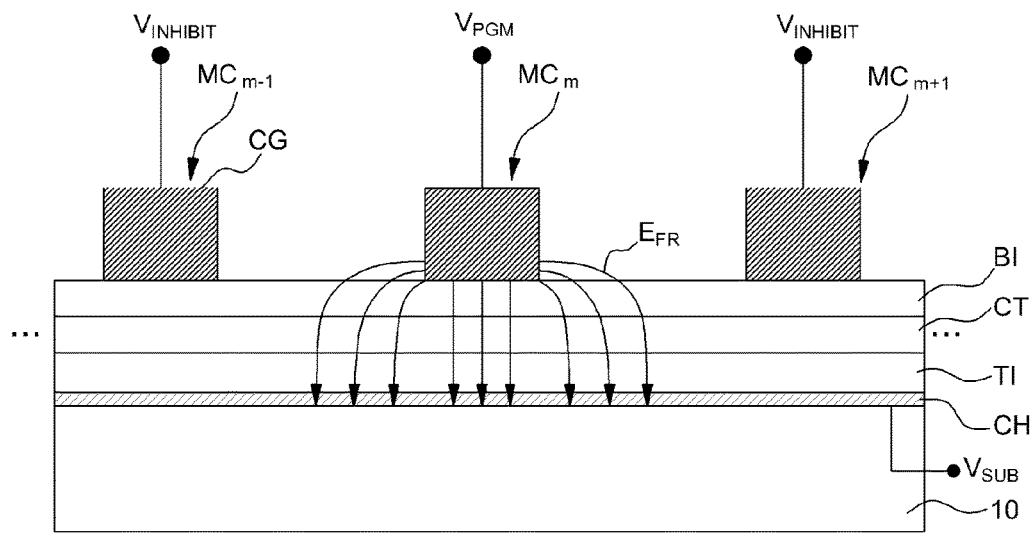
FIGS. 4A and 4B are schematic diagrams showing a distribution of electric fields and a distribution of program charges trapped in a charge trapping storage layer depending on the distribution of the electric fields, during a programming operation on the conventional non-volatile memory cell.
Figure 4B:
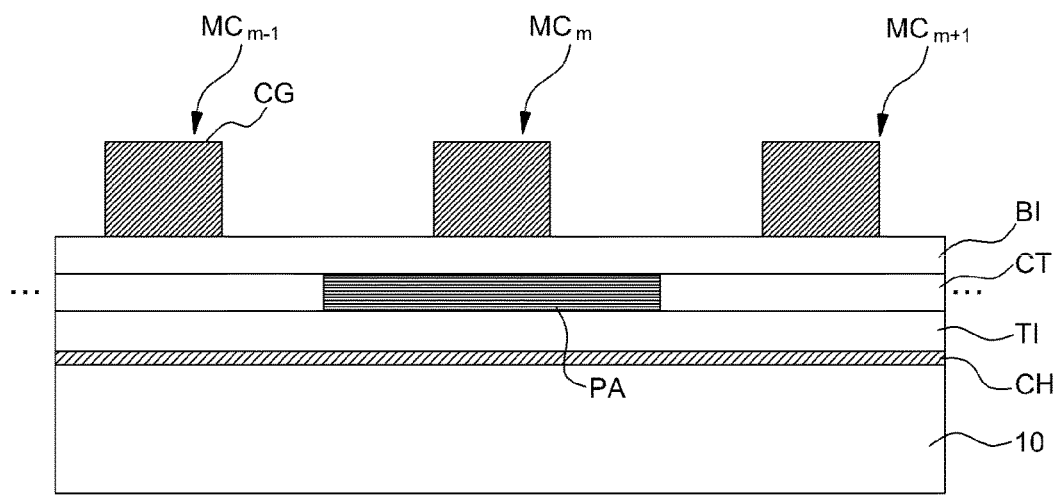

FIGS. 3A and 3B are schematic diagrams showing a distribution of electric fields and a distribution PA of program charges trapped in a charge trapping storage layer CT depending on the distribution of the electric fields, during a programming operation on a non-volatile memory cell including a sub-gate SG, according to an embodiment. FIGS. 4A and 4B are schematic diagrams showing a distribution of electric fields and a distribution PA of program charges trapped in a charge trapping storage layer CT depending on the distribution of the electric fields, during a programming operation on a conventional non-volatile memory cell without a sub-gate.

Referring to FIG. 3A, the control circuit 180 of FIG. 1 may program a memory cell $MC_m$, selected from among memory cells $MC_{m-1}$, $MC_m$, and $MC_{m+1}$ by applying program pulses to a control gate CG of the selected memory cell $MC_m$, as a program voltage $V_{PGM}$ using an incremental step pulse program (ISPP) technique. The applied program pulses have amplitudes increasing step-by-step while a program loop turn is increased. The programming operation may be performed by differentiating strengths of electric fields for the selected memory cell $MC_m$ and the unselected memory cells $MC_{m-1}$, and $MC_{m+1}$ by using a technique, such as self-boosting or self-boosted program inhibition. However, such programming techniques are merely examples, and the present disclosure is not limited thereto.

For example, in the programming operation, the program voltage $V_{PGM}$ (e.g., from about 15 V to about 20 V) may be applied to the control gate CG of the selected memory cell $MC_m$, whereas, in order to prevent undesired programming, a program inhibit voltage $V_{INHIBIT}$, which is a positive voltage from about 8 V to about 10 V, may be applied to the unselected memory cells $MC_{m-1}$ and $MC_{m+1}$. According to an embodiment, a substrate potential $V_{SUB}$ may be grounded. Referring to the memory cell array 110 of FIG. 1, a gate electrode and a bitline of a string select transistor SST corresponding to a string including the selected memory cell $MC_m$, may be grounded, and a voltage $V_{DD}$ may be applied to the unselected memory cells $MC_{m-1}$ and $MC_{m+1}$. Next, as known in the art, after program pulses are applied to the selected memory cell $MC_m$, a verifying operation for determining whether the programmed memory cell $MC_m$ reached a threshold voltage (i.e., a target value) may be performed.

During the programming operation, a voltage $V_{SG}$ having a polarity opposite to a polarity of the program voltage $V_{PGM}$ applied to the control gate CG may be applied to sub-gates $SG_1$ and $SG_2$ at two opposite sides of the control gate CG of the selected memory cell $MC_m$ via selected sub-wordlines among, e.g., the sub-wordlines SWL1, . . . , and SWLn-1 of FIG. 1. The sub-gates $SG_1$ and $SG_2$ are therefore referred to as "selected sub-gates." A magnitude of the voltage $V_{SG}$ may be suitably adjusted to offset or reduce a size and a width of a fringing field due to the program voltage $V_{PGM}$.

According to an embodiment, an unselected sub-gate may be electrically floated. In another embodiment, similarly to an unselected control gate, the inhibit voltage $V_{INHIBIT}$ may be applied to the unselected sub-gate. During the programming operation, there is a fringing field $E_{FR}$ emitted from side surfaces of the control gate CG of the selected memory cell $MC_m$ toward the channel layer CH. However, the fringing field $E_{FR}$ may be offset by an electric field $E_{CF}$ which is induced by the voltage $V_{SG}$ applied to the sub-gates $SG_1$ and $SG_2$ in a direction opposite to a direction of the fringing field $E_{FR}$. As a result, tunnelling of program charges from the channel layer CH to a charge trapping storage layer CT (e.g., the inter-memory cell region IA of FIG. 2) due to the fringing field $E_{FR}$ of the control gate CG may be reduced and suppressed, and thus a program region PA of the charge trapping storage layer CT may be concentrated below the control gate CG of the selected memory cell $MC_m$. As a result, a distribution width of program charges, that is, the width of the program regions PA may be reduced.

According to an embodiment, a width $W_1$ of the sub-gate SG may be designed such that a ratio $W_1/W_2$ of the width $W_1$ to a distance $W_2$ between the sub-gate SG and its adjacent control gate CG is from about 0.1 to about 1. If the ratio $W_1/W_2$ is smaller than 0.1, the distance $W_2$ between the sub-gate SG and the adjacent control gate CG increases, and thus the offset effect of the fringing field $E_{FR}$ of the control gate CG by using the electric field $E_{CF}$ in a counter direction may be reduced. On the other hand, if the ratio $W_1/W_2$ exceeds 1, integration density may be reduced due to the relatively large width $W_1$ of the sub-gate SG.

In contrast, referring to FIG. 4A, when a programming operation is performed in the conventional memory cell structure, the program voltage $V_{PGM}$ is applied to the control gate CG of the selected memory cell $MC_m$, the program inhibit voltage $V_{INHIBIT}$ may be applied to the control gates of the unselected memory cells $MC_{m-1}$ and $MC_{m+1}$, and the channel layer CH may be grounded, the fringing field $E_{FR}$ is fully emitted from the sidewall of the control gate CG between the adjacent memory cells $MC_{m-1}$ and $MC_{m+1}$ toward the channel layer CH, and thus a magnitude and a dispersion width of the fringing field $E_{FR}$ may be greater than those of the memory cell structure shown in FIG. 3A. Therefore, referring to FIG. 4B, tunnelling of program charges from the channel layer CH due to the fringing field $E_{FR}$ may be caused in an inter-memory cell region (e.g., the inter-memory cell region IA of FIG. 2). As a result, a significant amount of program charges may be trapped in the inter-memory cell region IA, and the width of the program region PA shown in FIG. 4B may be greater than that of the program region PA shown in FIG. 3B.

In the conventional memory cell structure, as programming operations are repeated, program charges may be accumulated in the inter-memory cell regions IA of the charge trapping storage layer CT. As a result, resistances of portions of the channel layer CH overlapping the inter-memory cell regions IA may increase due to the accumulated program charges in the inter-memory cell regions IA, and thus transconductance and a read current may be deteriorated. Furthermore, in the charge trapping storage layer CT including a dielectric, the accumulated program charges may be de-trapped from the program regions PA and spread toward the adjacent memory cells $MC_{m-1}$ and $MC_{m+1}$ by various conduction mechanisms of the dielectric, such as Poole-Frankel emission, hopping conduction based on tunnelling of trapped electrons, and space-charge-limited-conduction (SCLC). In this case, a threshold voltage $V_{TH}$ of the programmed selected memory cell $MC_m$ may be changed. In worse cases, the selected memory cell $MC_m$ may lose data stored therein, a read error may occur. In addition, errors may occur in data states of adjacent memory cells.

However, according to an embodiment, while an electric field applied to a channel layer CH below a control gate electrode CG is maintained constant, a dispersion of a fringing field $E_{FG}$ may be screened by using a sub-gate electrode SG, thereby suppressing accumulation of program charges in inter-memory cell regions IA of a charge trapping storage layer CT. Therefore, deterioration of memory operations due to accumulation of trapped charges in the inter-memory cell regions IA may be prevented, and data retention performance may be improved.

Figure 5A:
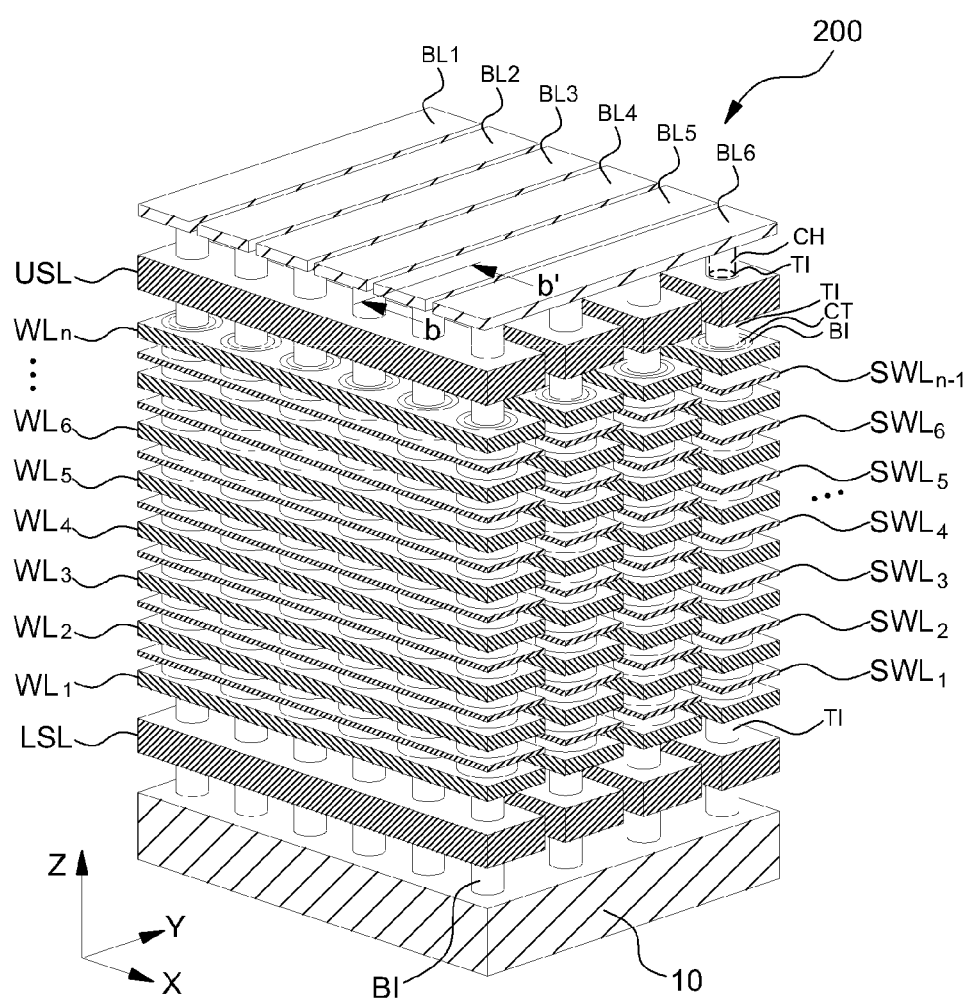
FIG. 5A is a perspective view of a 3-dimensional non-volatile memory device according to an embodiment.
Figure 5B:
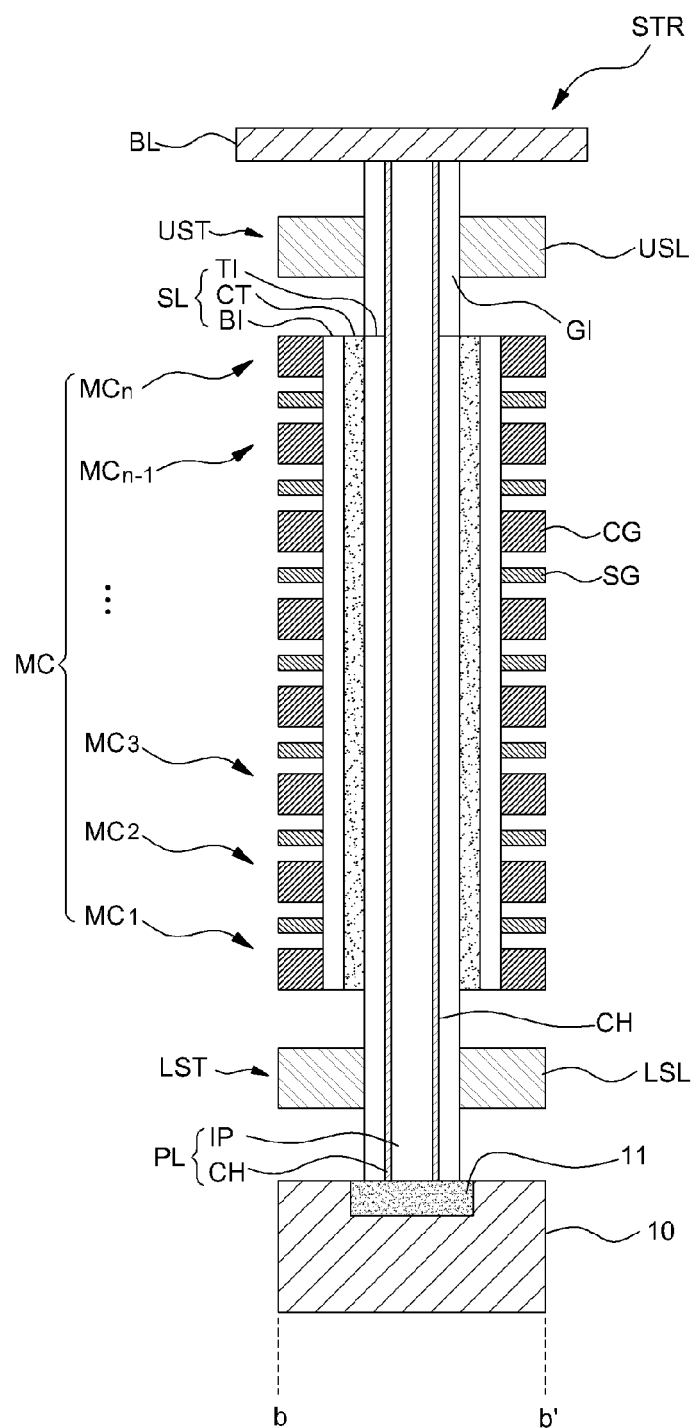
FIG. 5B is a cross-sectional view of a memory string of the 3-dimensional non-volatile memory device, taken along a line b-b' of FIG. 5A.

FIG. 5A is a perspective view of a 3-dimensional non-volatile memory device 200 according to an embodiment, and FIG. 5B is a cross-sectional view of a memory string STR of the 3-dimensional non-volatile memory device 200, taken along a line b-b' of FIG. 5A.

Referring to FIGS. 5A and 5B, the non-volatile memory device 200 may include a memory cell array having a plurality of memory strings STR. The memory cell array may further include a plurality of bitlines, e.g., BL1 through BL6, a plurality of wordlines WL1 through WLn, upper select lines USL, lower select lines LSL, and a common source line 11 (e.g., an impurity region) formed in a substrate 10. The plurality of memory strings STR may be connected between the bitlines BL1 through BL6 and the common source line 11.

The memory string STR may include string select transistors UST and LST, which correspond to the string select transistor SST and the ground select transistor GST in FIG. 1, respectively, and a plurality of memory cells MC, which are connected to one another in series between the upper string select transistor UST and the lower string select transistor LST. A drain of the upper string select transistor UST may be connected to a corresponding one of the bitlines BL1 through BL6, whereas a source of the lower string select transistor LST may be connected to the common source line 11. The common source line 11 is a wire to which sources of lower select transistors LST of the plurality of memory strings STR are connected in common.

The upper string select transistor UST may be connected to the upper select line USL, whereas the lower string select transistor LST may be connected to the lower select line LSL. There may be a plurality of upper string select transistors UST and a plurality of lower string select transistors LST in the memory cell array. Furthermore, each of the string select transistors UST and LST may have a non-volatile memory cell structure, and may have a certain status value for selecting a corresponding memory string STR. Control gates CG of the memory cells MC in the memory string STR may be coupled with wordlines WL1 through WLn, respectively.

A plurality of semiconductor pillars PL for providing channel layers CH extending in a vertical direction (i.e., the z-axis direction) may be arranged on the substrate 10, such that the string select transistors UST and LST and the memory cells MC may be connected to one another in series. The semiconductor pillars PL are not limited to a structure penetrating through conductive layers LSL, WL, and USL, and may be coupled with the conductive layers LSL, WL, and USL by contacting portions of sidewalls of the conductive layers LSL, WL, and USL.

The semiconductor pillars PL may be electrically connected to the impurity region 11 disposed in the substrate 10. As shown in FIG. 5B, each of the semiconductor pillars PL may have a core-shell structure including an insulation pillar IP as an internal core and a semiconductor material layer surrounding a sidewall of the insulation pillar IP. The semiconductor material layer will become the channel layer CH. According to another embodiment, each of the semiconductor pillars PL may be entirely a solid-type semiconductor layer or a hollow-type semiconductor layer for providing the channel layer CH.

In connection with the channel layer CH of the semiconductor pillar PL, the features of the channel layer CH described above with reference to FIG. 2 may be referred to unless they are contradictory to the present embodiment. For example, as described above with reference to FIG. 2, the semiconductor pillar PL may include a monocrystalline or polycrystalline semiconductor material. The semiconductor material layer may include silicon (Si), germanium (Ge), a silicon-germanium compound, or a group III-V semiconductor material, such as GaAs or InP. However, the above-stated materials are merely examples, and the present disclosure is not limited thereto. For example, the semiconductor pillar PL may provide the channel layer CH by using another semiconductor material such as carbon nano-tube, graphene, or a metal oxide. If necessary, the channel layer CH may be doped with an impurity in order to form an N+ or P+ conductive type semiconductor layer.

A data storage layer SL may be formed on a sidewall of the semiconductor pillar PL on which a plurality of memory cells of a single string STR are defined. The data storage layer SL may include a first insulation layer TI, a charge trapping storage layer CT, and a second insulation layer BI in the order stated in a direction from the channel layer CH toward the control gate CG. The first insulation layer TI may be a tunnelling insulation layer, whereas the second insulation layer BI may be a blocking insulation layer. The stacked structure of the insulation layers may not be individualized to each of the memory cells, and may expand to adjacent memory cells. Thus, the charge trapping storage layer CT may be shared by the plurality of memory cells constituting the single string STR. The tunnelling insulation layer TI may extend along the vertical direction on the sidewall of the semiconductor pillar PL to a pattern of the upper select line USL and thus may function as a gate insulation layer GI for the upper string select transistor UST. Furthermore, in an embodiment, at least a portion of the data storage layer SL may be formed along the sidewalls of the control gates CG, and may fill spaces between the control gates CG. That is, at least a portion of the data storage layer SL may extend in a direction parallel to the main surface of the substrate 10 to fill the spaces between the control gates CG adjacent to each other in the z-axis direction.

The control gate CG may include a first conductor having a first work function. For example, the first conductor may include at least one of a doped poly-silicon, aluminium (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof. However, the above-stated materials are merely examples, and the present disclosure is not limited thereto.

One of the sub-gates SG may be provided between adjacent control gates CG. From another point of view, two of the sub-gates SG may be provided at two opposite sides of one of the control gates CG. The sub-gates SG may be electrically insulated from the control gates CG. Each of the sub-gates SG may include a conductive material identical to that of the control gates CG. The sub-gates SG may be respectively coupled with the sub-wordlines $SWL_1$, $SWL_2$, . . . , and $SWL_{n-1}$ and connected to a row decoder (e.g., the row decoder 120 in FIG. 1).

According to some embodiments, as shown in FIG. 2, the sub-gates SG may be omitted at the outer sides of the first memory cell $MC_1$ at a first end of a memory cell string STR and the last memory cell MCn at a second end of the memory cell string STR. Although one sub-gate SG is provided between two adjacent control gates CG in the embodiment shown in FIG. 5A, the embodiment shown in FIG. 5A is merely an example, and the present disclosure is not limited thereto.

For example, two or more sub-gates SG may be provided between two adjacent control gates CG, wherein the plurality of sub-gates SG may be arranged to suitably divide the space between the control gates CG. When a selected memory cell is being programmed, a first sub-gate closest to the selected memory cell, among the plurality of sub-gates, may be biased to a voltage having a polarity opposite to a polarity of a program voltage applied to a control gate of the selected memory cell, whereas other sub-gates away from the selected memory cell, among the plurality of sub-gates, may be electrically floated or an inhibit voltage may be applied thereto. The sub-gates SG may include a conductive material identical to that of control gates CG, but the present disclosure is not limited thereto.

According to an embodiment, during a programming operation on the non-volatile memory device 200, irrespectively of a magnitude of an electric field applied to the channel layer CH below a control gate CG, a fringing field emitted from a sidewall of the control gate CG may be reduced or eliminated by using a sub-gate SG. Therefore, trapping of program charges in inter-memory cell regions IA of a charge trapping storage layer CT may be suppressed, thereby preventing deterioration of memory operations due to accumulation of trapped charges in the inter-memory cell regions and improving data retention performance.

The 3-dimensional non-volatile memory device having a vertical channel illustrated in FIGS. 5A and 5B is merely an example, and the present disclosure is not limited thereto. For example, as known in the art, various modifications based on various structures including SMArT, bit cost scalable (BiCS) technology, piped-BiCS (P-BiCS), vertical-recess-array-transistor (VRAT), and terabit cell array transistor (TCAT) may be applied to the illustrated 3-dimensional non-volatile memory device.

FIGS. 6A through 6G are cross-sectional views showing a method of fabricating a 3-dimensional non-volatile memory device according to an embodiment. Descriptions given above may be referred to in relation to components denoted by the same reference numerals as the above-stated components, unless being contradictory.

Figure 6A:
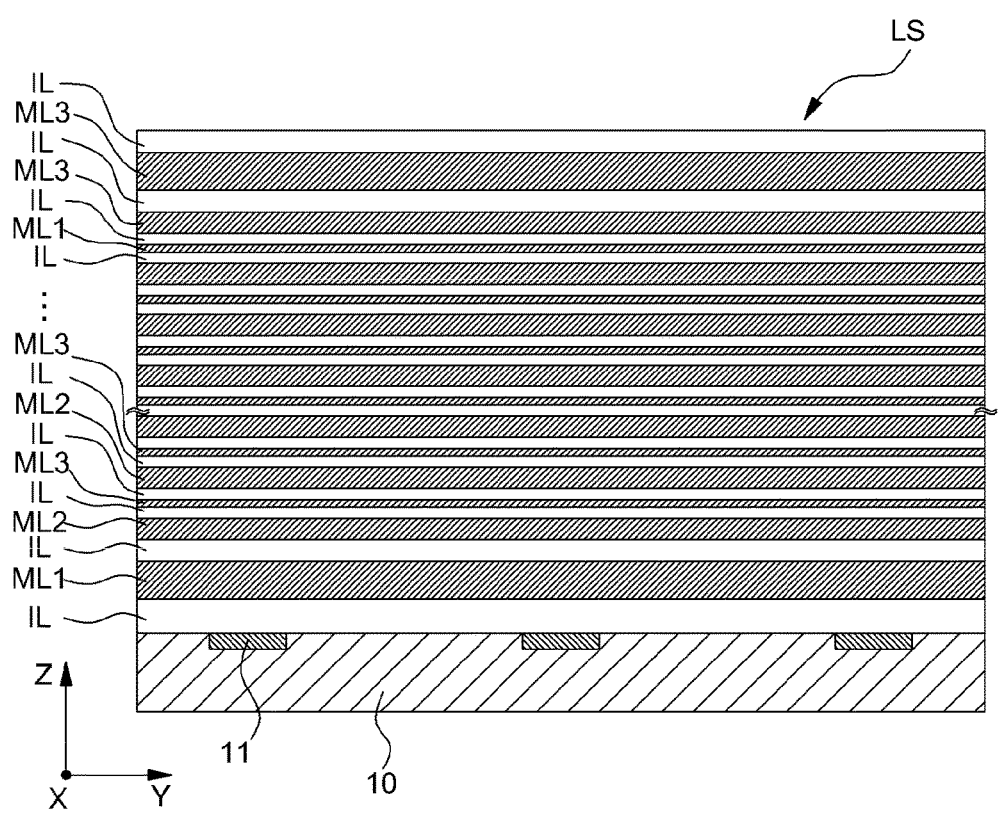
FIGS. 6A through 6G are cross-sectional views showing a method of fabricating a 3-dimensional non-volatile memory device according to an embodiment.

Referring to FIG. 6A, a substrate 10 may be provided. An impurity region 11 for forming a common source line may be formed in the substrate 10. A stacked structure LS may be formed by alternately and repeatedly stacking an insulation layer IL and conductive layers ML1, ML2, and ML3 on the substrate 10 in which the impurity region 11 is formed. The insulation layer IL may be a thin-film for electrically separating control gates of string select transistors and control gates of memory cell transistors from each other. Among the conductive layers ML1, ML2, and ML3, a first conductive layer ML1 is a conductive thin-film for forming gate electrodes (e.g., LSL and USL in FIG. 5B) of select transistors, a second conductive layer ML2 is a conductive thin-film for forming control gates (e.g., CG in FIG. 5B) of memory cells, and a third conductive layer ML3 is a thin-film for forming sub-gates (e.g., SG in FIG. 5B). The number of times for repeatedly stacking the insulation layer IL and the conductive layers ML1 through ML3 may be determined depending on the numbers of memory cells, select transistors, and ground transistors in a memory string STR. The first, second, and third conductive layers ML1, ML2, and ML3 may be formed by performing a thin-film forming process, such as physical vapour deposition (PVD), chemical vapour deposition (CVD), or atomic layer deposition (ALD).

According to an embodiment, a width $W_1$ (or a thickness in the z-axis direction) of the third conductive layer ML3 may be determined, such that a ratio $W_1/W_2$ of the width $W_1$ to a distance $W_2$ between the third conductive layer ML3 and the second conductive layer ML2 in the z-axis direction may be from about 0.1 to about 1. The description given above for the ratio $W_1/W_2$ with reference to FIG. 3B may also apply to the present embodiment.

Figure 6B:
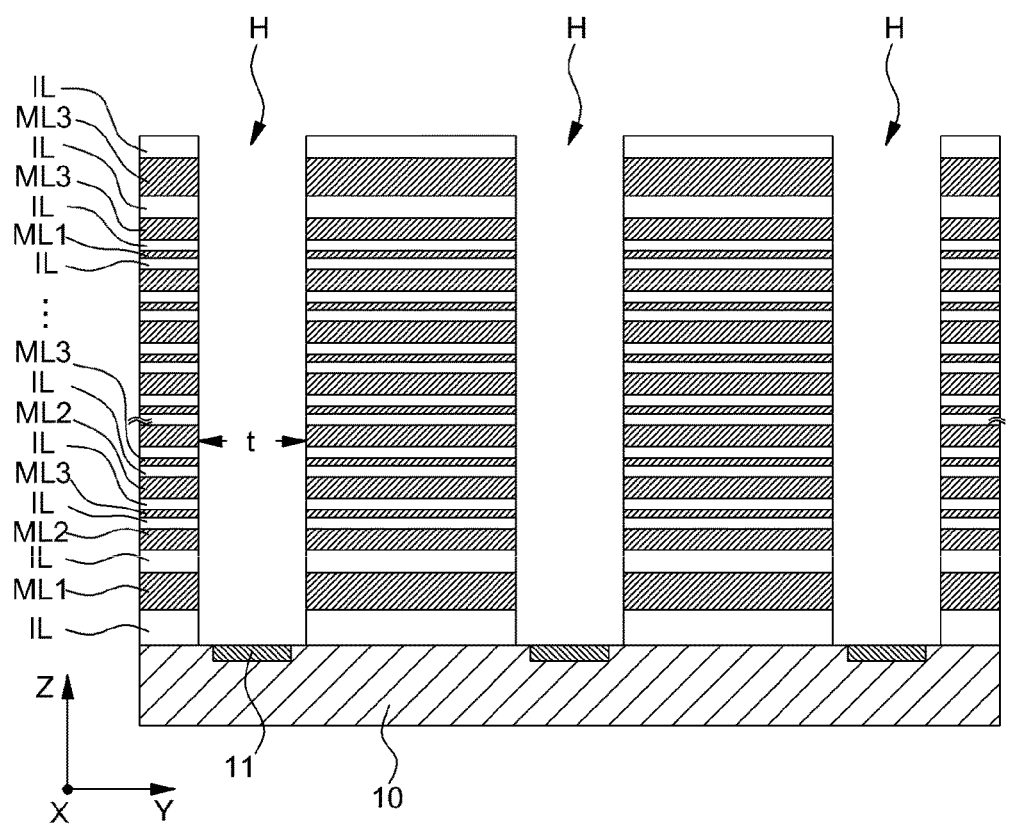

Referring to FIG. 6B, the stacked structure LS of FIG. 6A including the insulation layers IL and the conductive layers ML1 through ML3 may be patterned in the depth-wise direction (i.e., the z-axis direction), thereby forming via holes H vertical to a main surface of the substrate 10, the via holes H exposing the common source line 11. In a subsequent operation, memory strings are formed inside the via holes H, respectively. A width t of each of the via holes H may be determined by considering a width of a semiconductor pillar (refer to PL in FIG. 5B) and a thickness of a data storage layer (refer to SL in FIG. 5B), which are formed later. A cross-sectional shape of each of the via holes H in a direction perpendicular to the z-axis direction may be a circular shape or an elliptical shape. However, the present disclosure is not limited thereto.

Figure 6C:
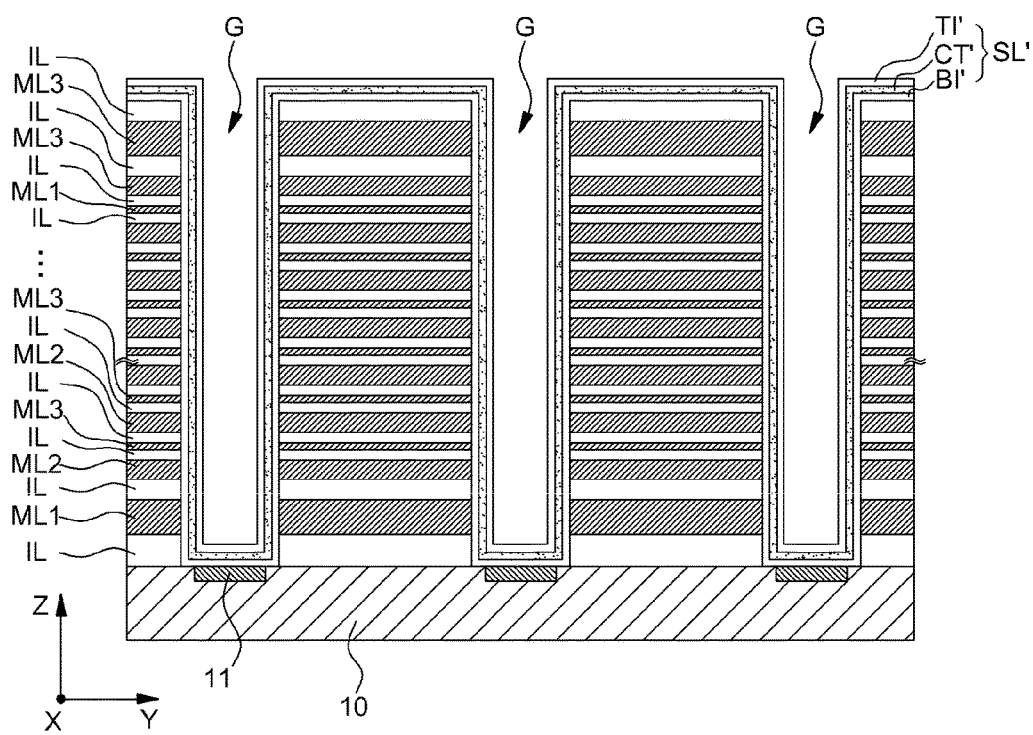

Referring to FIG. 6C, a data storage layer SL' may be formed on sidewalls of the via holes H. The data storage layer SL' may be formed by performing a thin-film forming operation with excellent step coverage along a profile of a resultant structure of FIG. 6B, e.g., chemical vapour deposition (CVD) or atomic layer deposition (ALD). As shown in FIG. 5B, the data storage layer SL' may be provided by sequentially forming a blocking insulation layer BI', a charge trapping storage layer CT', and a tunnelling insulation layer TI'. As the data storage layer SL' partially fills the via holes H, a groove region G may be formed in each of the via holes H in the patterned stacked structure LS.

Figure 6D:
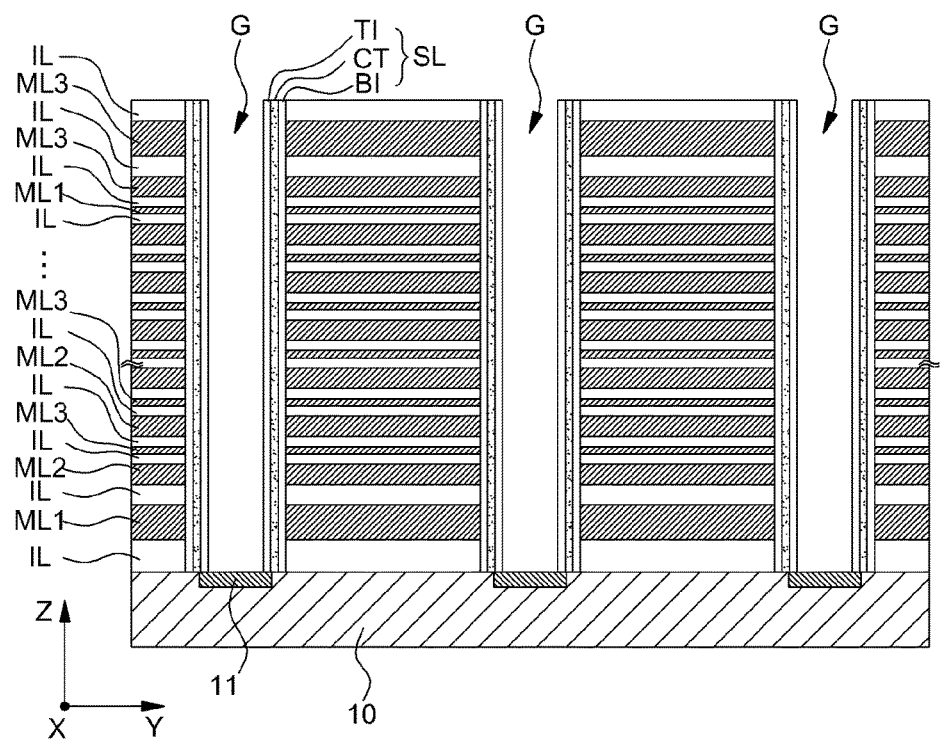

Referring to FIG. 6D, a portion of the data storage layer SL' formed over a surface of the common source line 11 may be removed. A portion of the data storage layer SL' parallel to the main surface of the substrate 10 may be removed by performing an anisotropic etch-back operation using plasma. By performing the anisotropic etch-back operation, portions of the data storage layer SL' on the top layer of the stacked structure LS and at the bottom of the groove area G may be removed, thereby exposing the common source line 11 in the substrate 10. As a result, a data storage layer SL including a blocking insulation layer BI, a charge trapping storage layer CT, and a tunnelling insulation layer TI may be provided along sidewalls of the groove area G.

Figure 6E:
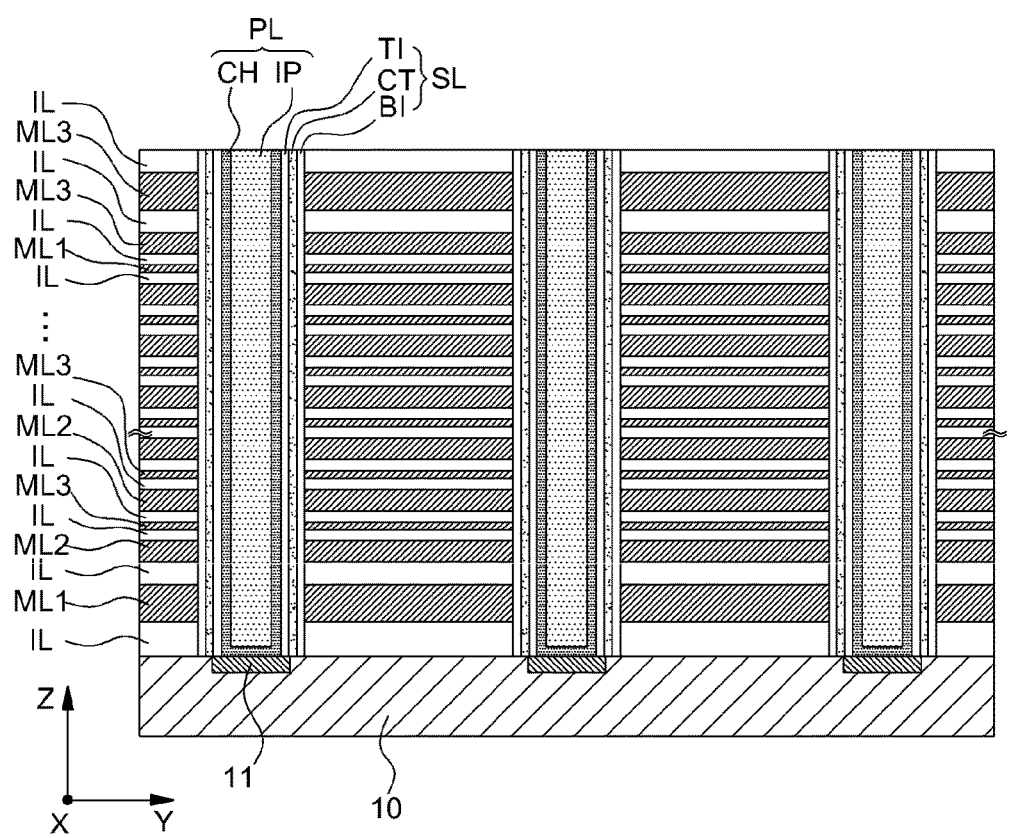

Referring to FIG. 6E, a semiconductor pillar PL including a channel layer CH extending in a direction vertical to the main surface of the substrate 10 (i.e., the z-axis direction) may be formed in the groove area G defined by the data storage layer SL. The semiconductor pillar PL may have a core-shell structure in which an internal core is an insulation pillar IP and the insulation pillar IP is surrounded by the channel layer CH. The semiconductor pillar PL is formed by forming a semiconductor material layer having a certain thickness on the sidewall and a bottom surface of the groove area G and then filling an empty portion of the groove area G with an insulator. In another embodiment, the groove area G may be entirely filled with a semiconductor material, thereby providing a solid-type semiconductor pillar. The bottom of the channel layer CH may be electrically connected to the common source line 11 formed in the substrate 10.

The descriptions given above may be referred to in relation to materials and other features of the semiconductor pillars PL, where the semiconductor pillars PL may be formed by a thin-film forming operation with excellent step coverage, e.g., chemical vapour deposition (CVD) or atomic layer deposition (ALD). Furthermore, as described above, the semiconductor pillar PL may be vertically aligned in the z-axis direction and may also have a U-like shape as in the piped BiCS (P-BiCS) structure that is known in the art.

Figure 6F:
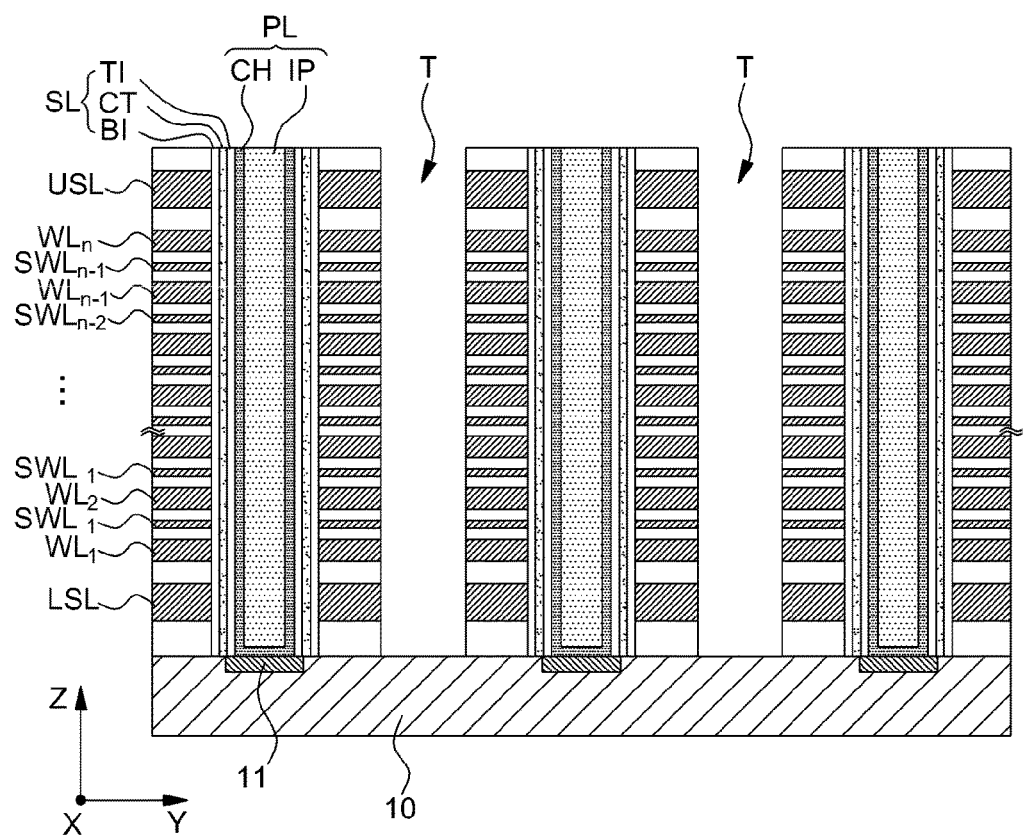

Referring to FIG. 6F, a trench T expanding in a first direction (e.g., the x-axis direction) and the vertical direction (i.e., the z-axis direction) may be formed in the patterned stacked structure LS including the semiconductor pillars PL. As a result, a portion of the patterned stacked structure LS that is disposed between two adjacent semiconductor pillars PL in FIG. 6E may be divided into two parts.

Figure 6G:
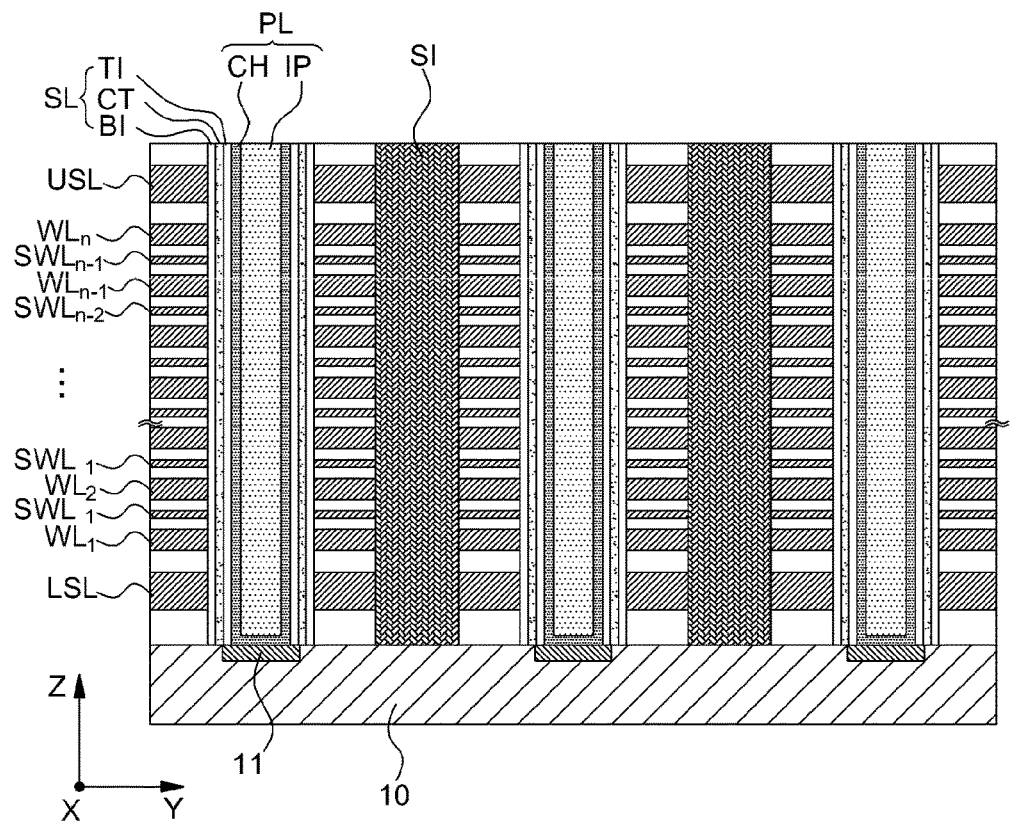

Next, referring to FIG. 6G, a device isolation layer DI may be provided by filling the trench T with an insulation layer, and the memory strings are electrically separated from one another in a second direction (e.g., the y-axis direction) by the device isolation layer DI. Next, by forming wires (not shown) like bitlines contacting the channel layers CH of the semiconductor pillars PL, a 3-dimensional non-volatile memory device similar to the 3-dimensional non-volatile memory device 200 shown in FIG. 5A may be provided. The channel layer CH may provide a gate all-around (GAA) structure surrounded by control gates.

The above-stated method is merely an example, and the present disclosure is not limited thereto. For example, in another embodiment, referring to FIG. 6A, insulation layers and sacrificing layers may be alternately and repeatedly stacked on the substrate 10 depending on the numbers of memory cells, select transistors, and ground transistors included in the device. Here, the sacrificing layer may include a material exhibiting an excellent etching selectivity against the insulation layer. Next, as shown in FIG. 6B, holes perpendicular to the substrate 10 are formed by successively patterning the stacked structure including the insulation layers and the sacrificing layers in the depth-wise direction (i.e., the negative z-axis direction), and semiconductor pillars (refer to PL of FIG. 6B) may be formed inside the via holes H. A first trench region expanding in a first direction (i.e., the x-axis direction) and a vertical direction (i.e., the z-axis direction) may be formed in the stacked structure having formed therein the semiconductor pillars, and thus a stacked structure including the insulation layer patterns and the sacrificing layer patterns exposed by the first trench region may be formed.

Next, by using the etching selectivity between the insulation layer patterns and the sacrificing layer patterns, only the sacrificing layer patterns may be selectively removed in a wet-etching operation. Next, cell spaces and sub-gate spaces in which sidewalls of the semiconductor pillars, that is, the channel layer CH is exposed may be formed between stacked insulation layer patterns. Next, it will be possible to form a data storage layer in the exposed cell spaces and the sub-gate spaces via a thin-film forming operation with excellent step coverage.

Figure 7:
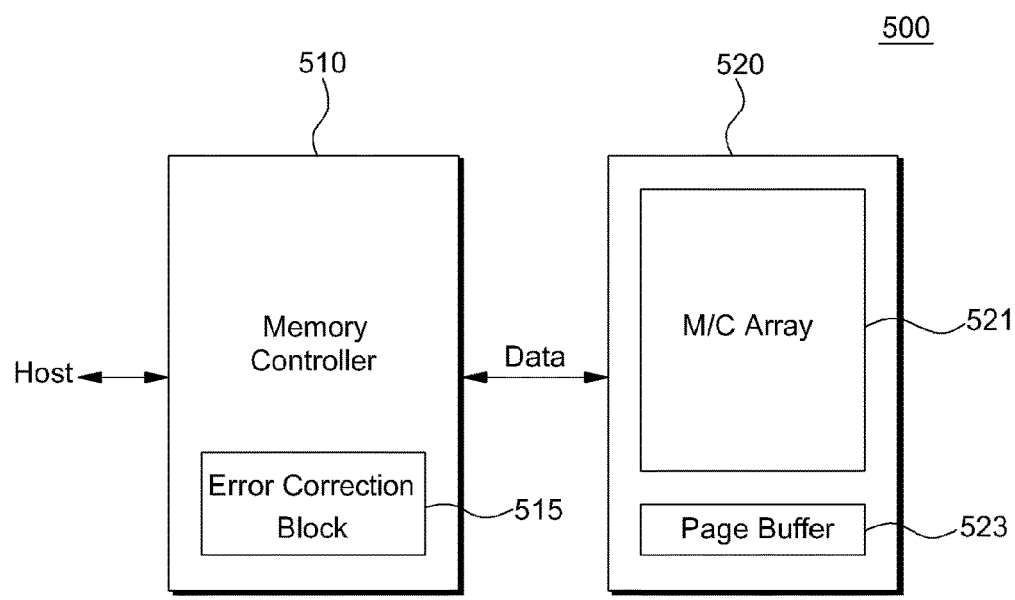
FIG. 7 is a block diagram showing a memory system according to an embodiment.

FIG. 7 is a block diagram showing a memory system 500 according to an embodiment.

Referring to FIG. 7, the memory system 500 includes a memory controller 510 and a non-volatile memory device 520. The memory controller 510 may perform error correcting operations with respect to the non-volatile memory device 520. The memory controller 510 may control the non-volatile memory device 520 based on commands and addresses from an external circuit.

The memory controller 510 may perform an error correcting encoding process on data requested to be written when the memory controller 510 receives a write request from a host. Furthermore, the memory controller 510 may control the non-volatile memory device 520 to program the encoded data at a memory region corresponding to a provided address. Furthermore, during a read operation, the memory controller 510 may perform an error correcting decoding process on data output from the non-volatile memory device 520. Errors included in output data may be corrected by the error correcting decoding process. To detect and correct the errors, the memory controller 510 may include an error correction block 515.

The non-volatile memory device 520 may include a memory cell array 521 and a page buffer 523. The memory cell array 521 may include an array of single-level memory cells or 2 or higher bit multi-level memory cells. When a programming instruction is received, according to the above embodiments, dispersion of a fringing field is restricted by employing a conductive cover layer, and thus program charges accumulated in inter-memory cell areas of a charge trapping storage layer may be reduced or suppressed.

Figure 8:
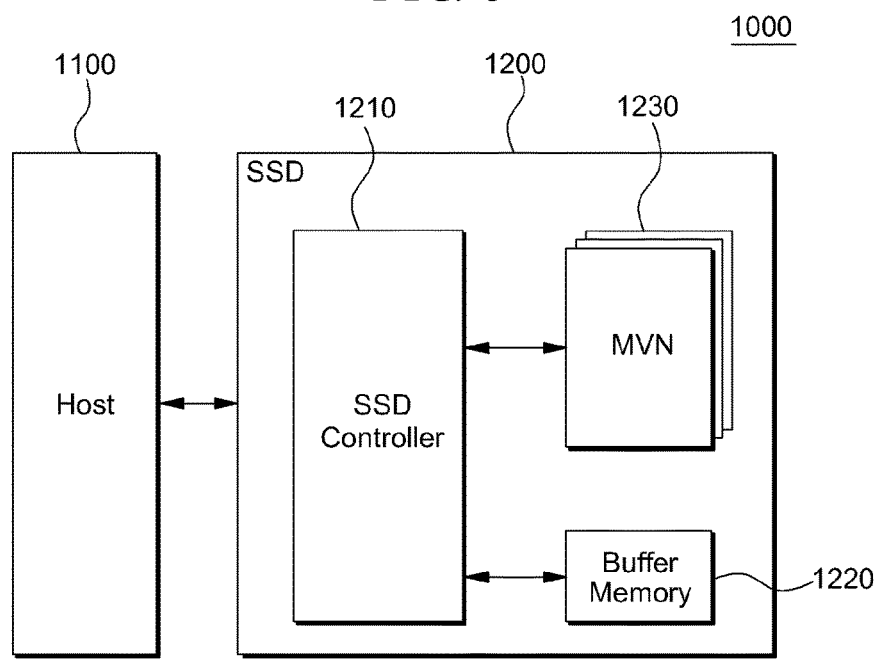
FIG. 8 is a block diagram showing a storage device including a solid state drive (SSD) according to an embodiment.

FIG. 8 is a block diagram showing a storage device 1000 including a solid state drive (SSD) according to an embodiment of the present disclosure.

Referring to FIG. 8, the storage device 1000 includes a host 1100 and an SSD 1200. The SSD 1200 may include an SSD controller 1210, a buffer memory 1220, and a non-volatile memory device 1230. The SSD controller 1210 provides electric and physical connections between the host 1100 and the SSD 1200. In an embodiment, the SSD controller 1210 provides an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding. Examples of the bus format of the host 1100 may include USB (Universal Serial Bus), SCSI (Small Computer System Interface), PCI express, ATA (Advanced Technology Attachment), PATA (Parallel ATA), SATA (Serial ATA), and SAS (Serial Attached SCSI).

Data to be written provided by the host 1100 or data read out from the non-volatile memory device 1230 may be temporarily stored in the buffer memory 1220. When the host 1100 sends a read request and data stored in the non-volatile memory device 1230 is cached, the buffer memory 1220 may provide a cache function for providing cached data directly to the host 1100. Generally, a data transmission rate based on a bus format (e.g., SATA or SAS) of the host 1100 may be faster than a data transmission speed of memory channels of the SSD 1200. In this case, the large-capacity buffer memory 1220 may minimize performance deterioration due to the speed difference. The buffer memory 1220 may be a synchronous DRAM for providing sufficient buffering performance. However, the present invention is not limited thereto.

The non-volatile memory device 1230 may be provided as a storage medium of the SSD 1200. For example, the non-volatile memory device 1230 may be a NAND-type flash memory with large storage capacity. For another example, a NOR-type flash memory, a phase-change memory, a magnetic memory, a resistive memory, a ferrodielectric memory, or a memory system including a combination thereof may be applied as the non-volatile memory device 1230.

Figure 9:
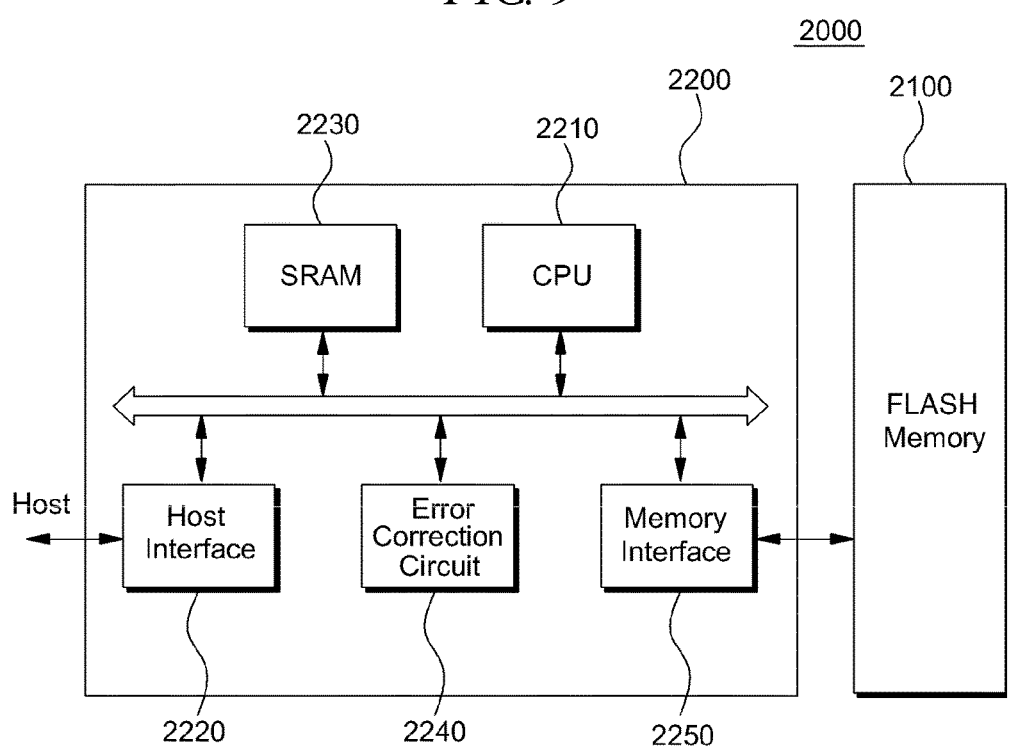
FIG. 9 is a block diagram showing a memory system according to another embodiment.

FIG. 9 is a block diagram showing a memory system 2000 according to another embodiment.

Referring to FIG. 9, the memory system 2000 may include a memory controller 2200 and a flash memory device 2100. The flash memory device 2100 may include the non-volatile memory devices 100, 200, and 300 as described above with reference to FIGS. 1 through 6G. The flash memory device 2100 may show reliable program performance.

The memory controller 2200 may control the flash memory device 2100. An SRAM 2230 may be used as an operation memory for a CPU 2210. A host interface 2220 may embody a data exchange protocol for connecting a host to the memory system 2000. An error correction circuit 2240 equipped in the memory controller 2200 may detect and correct errors included in data read out from the flash memory device 2100. A memory interface 2250 may perform interfacing with the flash memory device 2100. The CPU 2210 may perform overall control operations for data exchange of the memory controller 2200. The memory system 2000 may further include a ROM (not shown) that stores code data for interfacing with the host.

The flash memory device 2100 may communicate with an external circuit (e.g., the host) using one of various interface protocols, such as USB, MMC, PCI-E, SAS, SATA, PATA, SCSI, ESDI, or IDE. The memory system 2000 in accordance with the present embodiment may be applied to various user devices, such as an ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, or a home network.

Figure 10:
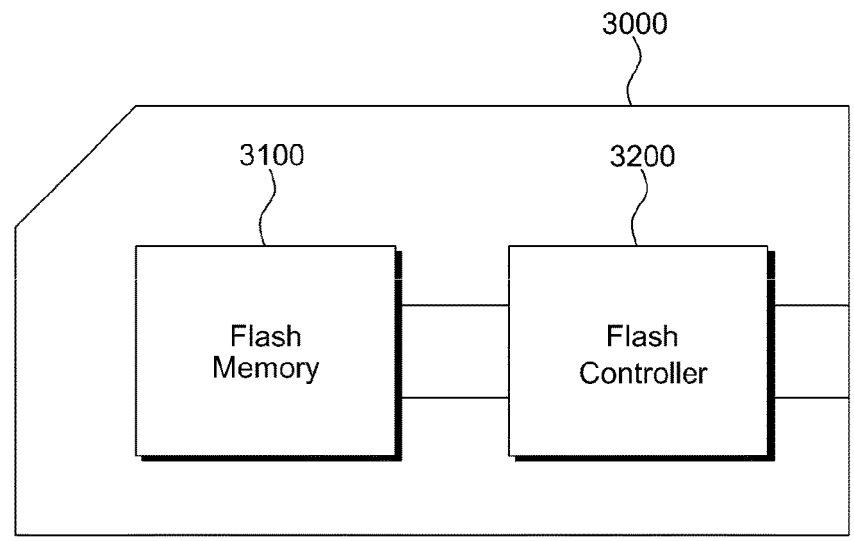
FIG. 10 is a block diagram showing a data storage device according to another embodiment.

FIG. 10 is a block diagram showing a data storage device 3000 according to another embodiment.

Referring to FIG. 10, the data storage device 3000 may include a flash memory 3100 and a flash controller 3200. The flash controller 3200 may control the flash memory 3100 based on control signals received from an external circuit. A 3-dimensional memory array structure of the flash memory 3100 may be a channel-stacked type structure, a straight-shaped bit cost scalable (BiCS) structure, or a pipe-shaped BiCS structure, but the present disclosure is not limited thereto. The 3-dimensional memory array structure of the flash memory 3100 may be a commercially-known SMArT structure or a TCAT structure.

The data storage device 3000 may constitute a memory card device, an SSD device, a multimedia card device, an SD card, a memory stick device, a hard disk drive device, a hybrid drive device, or a USB flash device. For example, the data storage device 3000 may be a memory card that satisfies a standard or a specification to be used by an electronic device, such as a digital camera or a personal computer.

Figure 11:
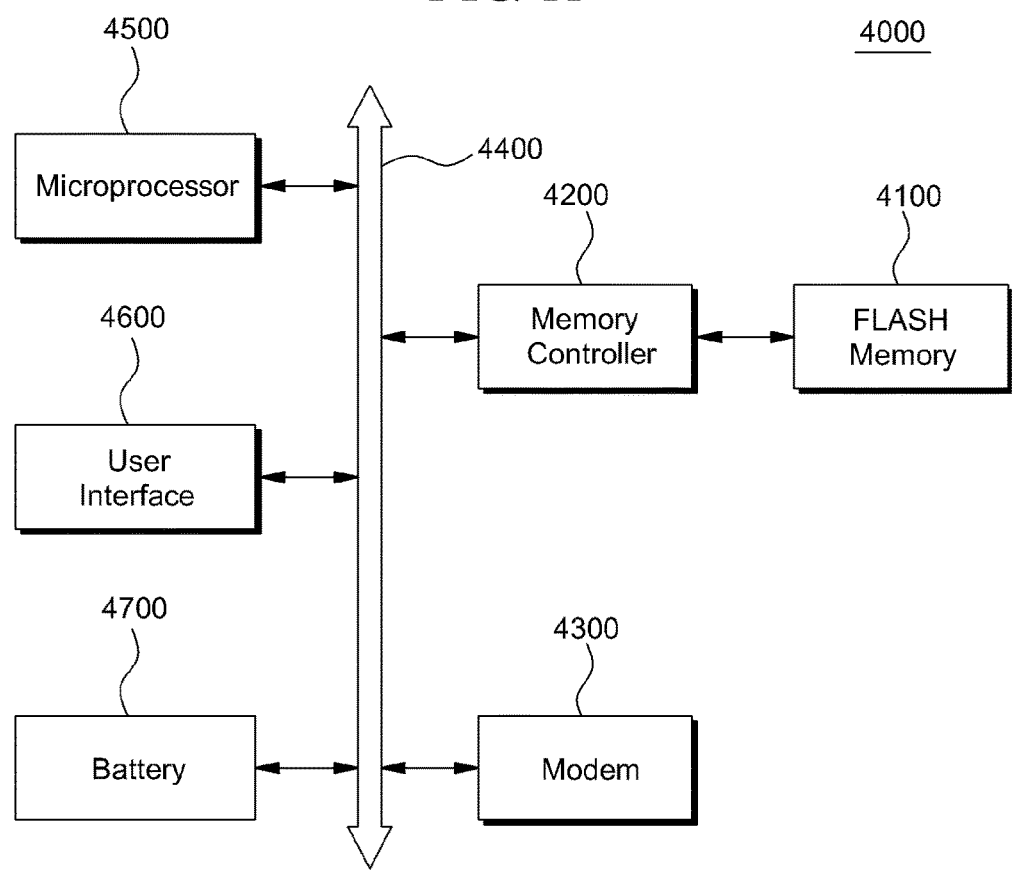
FIG. 11 is a block diagram showing a computing system that includes a flash memory device according to an embodiment.

FIG. 11 is a block diagram showing a computing system 4000 that includes a flash memory device 4100 according to an embodiment.

Referring to FIG. 11, the computing system 4000 in accordance with the present embodiment may further include a memory controller 4200, a modem 4300, such as a baseband chipset, a microprocessor 4500, and a user interface 4600, which are electrically connected to a bus 4400.

The flash memory device 4100 shown in FIG. 13 may be a non-volatile memory device as described above. The computing system 4000 in accordance with the present embodiment may be a mobile device. In this case, the computing system 4000 may further include a battery 4700 for supplying a power for operating the computing system 4000. Although not shown, in other embodiments, the computing system 4000 may further include an application chipset, a camera image processor (CIS), or a mobile DRAM. The memory controller 4200 and the flash memory device 4100 may constitute an SSD using a non-volatile memory device for storing data.

A non-volatile memory device and/or a memory controller according to the present disclosure may be mounted using various types of packages. For example, a non-volatile memory device and/or a memory controller may be mounted using any of various packages, such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (S SOP), Thin Small Outline (TSOP), System In Package (SIP), Multi Chip Package (MCP), Wafer-level Fabricated Package (WFP), or Wafer-Level Processed Stack Package (WSP).

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A non-volatile memory device, comprising:
    a channel layer;
    a data storage layer disposed on the channel layer;
    a plurality of control gates arranged on the data storage layer and spaced apart from one another; and
    one or more sub-gates, at least one of the sub-gates being arranged between two adjacent control gates.

2. The non-volatile memory device of claim 1, wherein, during a programming operation, a voltage is applied to a sub-gate adjacent to a selected control gate from among the plurality of control gates, the voltage applied to the adjacent sub-gate having a polarity opposite to a polarity of a program voltage, the program voltage being applied to the selected control gate.

3. The non-volatile memory device of claim 1, wherein, during a programming operation, an unselected sub-gate is electrically floated or an inhibit voltage is applied to the unselected sub-gate.

4. The non-volatile memory device of claim 1, wherein, a ratio of a width of each sub-gate to a distance from a sub-gate to an adjacent control gate is from 0.1 to 1.

5. The non-volatile memory device of claim 1, wherein the one or more sub-gates comprise a conductive material identical to a conductive material of the plurality of control gates.

6. The non-volatile memory device of claim 1, wherein each of the sub-gates comprises any one of a doped polysilicon, aluminum (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof.

7. The non-volatile memory device of claim 1, wherein the data storage layer comprises:

a tunnelling insulation layer contacting the channel layer;
a blocking insulation layer contacting the plurality of control gates; and
a charge trapping storage layer disposed between the tunnelling insulation layer and the blocking insulation layer.

8. The non-volatile memory device of claim 1, wherein the channel layer extends in a direction vertical to a main surface of a substrate on which the non-volatile memory device is to be formed.

9. The non-volatile memory device of claim 1, wherein the data storage layer is shared by the plurality of control gates.

10. The non-volatile memory device of claim 9, wherein the non-volatile memory device has a SMArT structure, a bit cost scalable (BiCS) structure, a piped BiCS (P-BiCS) structure, a vertical-recess-array-transistor) structure, or a terabit cell array transistor (TCAT) structure.

11. A non-volatile memory device, comprising:
memory cell strings, each memory cell string comprising a plurality of memory cells connected to one another in series;
wordlines connected to control gates of the plurality of memory cells, respectively;
sub-wordlines, at least one of the sub-wordlines being arranged between two adjacent wordlines;
bitlines connected to first ends of the memory cell strings, respectively;
a row decoder electrically connected to the plurality of memory cells via the wordlines and the sub-wordlines; and
a column decoder electrically connected to the memory cell strings via the bitlines.

12. The non-volatile memory device of claim 11, wherein a number of the sub-wordlines is one less than a total number of the wordlines.

13. The non-volatile memory device of claim 11, wherein, during a programming operation, a voltage having a polarity opposite to a polarity of a program voltage is applied to a sub-wordline adjacent to a selected wordline from among the plurality of wordline, the program voltage being applied to the selected wordline.

14. The non-volatile memory device of claim 11, wherein, during a programming operation, an unselected sub-wordline is electrically floated or an inhibit voltage is applied to the unselected sub-wordline.

15. A method of fabricating a non-volatile memory device, the method comprising:
forming a stacked structure by alternately and repeatedly forming one or more insulation layers and a plurality of conductive layers on a substrate, wherein the plurality of conductive layers comprise first conductive layers for forming control gates and second conductive layers for forming sub-gates, at least one of the sub-gates being formed between two adjacent control gates;
forming via holes extending in a vertical direction that is normal to a main surface of the substrate by patterning the stacked structure;
forming a data storage layer on a sidewall of each of the via holes; and
forming a semiconductor pillar comprising a channel layer in a groove region defined by the data storage layer in each of the via holes.

16. The method of claim 15, wherein the first conductive layers and the second conductive layers comprise an identical conductive material.

17. The method of claim 15, wherein the second conductive layer comprises any one of a doped poly-silicon, aluminum (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof.

18. The method of claim 15, wherein, a ratio of a width of the second conductive layer to a distance from the second conductive layer to an adjacent first conductive layer is from 0.1 to 1.

19. The method of claim 15, wherein forming the data storage layer comprises:
forming a blocking insulation layer on the sidewall of each of the via holes so that the blocking insulation layer contacts the control gates formed by patterning the stacked structure;
forming a charge trapping storage layer on the blocking insulation layer; and
forming a tunnelling insulation layer on the charge trapping storage layer,
wherein the tunneling insulation layer contacts the channel layer.

* * * * *